United States Patent
Zens

(10) Patent No.: US 11,726,152 B1
(45) Date of Patent: Aug. 15, 2023

(54) SOLID SAMPLE MAGNETIC COUPLING HIGH RESOLUTION NUCLEAR MAGNETIC RESOLUTION PROBE AND METHOD OF USE

(71) Applicant: JEOL LTD., Tokyo (JP)

(72) Inventor: Albert Zens, Peabody, MA (US)

(73) Assignee: JEOL LTD., Tokyo (JP)

( * ) Notice: Subject to any disclaimer, the term of this patent is extended or adjusted under 35 U.S.C. 154(b) by 0 days.

(21) Appl. No.: 17/896,416

(22) Filed: Aug. 26, 2022

(51) Int. Cl.
*G01R 33/36* (2006.01)
*G01R 33/34* (2006.01)
(Continued)

(52) U.S. Cl.
CPC ....... *G01R 33/3635* (2013.01); *G01R 33/307* (2013.01); *G01R 33/343* (2013.01); *G01R 33/34053* (2013.01); *G01R 33/34092* (2013.01)

(58) Field of Classification Search
CPC .............. G01R 33/3635; G01R 33/307; G01R 33/34053; G01R 33/34092; G01R 33/343
See application file for complete search history.

(56) References Cited

U.S. PATENT DOCUMENTS

| 3,789,832 A | 2/1974 | Damadian |
| 4,301,410 A | 11/1981 | Wind |

(Continued)

FOREIGN PATENT DOCUMENTS

| JP | WO2008154933 A | 12/2006 |
| WO | WO2007/020537 | 2/2007 |

(Continued)

OTHER PUBLICATIONS

Bowyer, p et al., "Using magnetic 1-25 coupling to implement 1H,19F,13C experiments in routine high resolution NMR probes", Journal Magnetic Resonance, vol. 261, (2015), pp. 190-198.

(Continued)

*Primary Examiner* — Dixomara Vargas
(74) *Attorney, Agent, or Firm* — Sci-Law Strategies, PC

(57) ABSTRACT

In various embodiments of the invention, a solid sample magic angle spinning nuclear magnetic resonance (NMR) probe can utilize an appropriate inductance parent coil with a fixed capacitor and introducing an idler coil with a variable capacitor which can inductively couple to the parent coil by adjusting the variable capacitance of the idler coil. By coupling the idler coil to the parent coil in this manner a double resonance circuit can be provided without the disadvantages of prior art coils. In an alternative embodiment of the invention, a solid sample magic angle spinning nuclear magnetic resonance probe can utilize an appropriate inductance parent coil with a fixed capacitor, introducing an idler coil with a variable capacitor in a first region and two variable inductor coupling coils and two coupling coils in a second region, where the two variable inductors are connected to the parent coil to reduce the number of coils in the sample region of the NMR probe, where variable inductors can inductively couple to the parent coil by adjusting one or both the capacitance of the variable capacitor of the idler coil and/or adjusting the variable inductors to observe a tuned condition between the parent coil and the idler coil.

20 Claims, 20 Drawing Sheets

(51) Int. Cl.
*G01R 33/30* (2006.01)
*G01R 33/343* (2006.01)

(56) References Cited

U.S. PATENT DOCUMENTS

| | | | |
|---|---|---|---|
| 4,398,149 A | 8/1983 | Zens | |
| 4,517,516 A | 5/1985 | Hill | |
| 4,549,136 A | 10/1985 | Zens | |
| 4,609,872 A | 9/1986 | O'Donnell | |
| 4,654,592 A | 3/1987 | Zens | |
| 4,654,593 A | 3/1987 | Ackerman | |
| 4,751,465 A | 6/1988 | Zens | |
| 4,833,412 A | 5/1989 | Zens | |
| 4,947,120 A | 8/1990 | Frank | |
| 5,003,265 A | 3/1991 | Leussler | |
| H1218 H | 8/1993 | Cory | |
| 5,243,289 A | 9/1993 | Blum | |
| 5,483,163 A | 1/1996 | Wen | |
| 5,760,586 A * | 6/1998 | Foerster | G01R 33/307 324/318 |
| 7,064,549 B1 | 6/2006 | Hudson | |
| 7,088,102 B1 | 8/2006 | Zens | |
| 7,106,063 B1 | 9/2006 | Zens | |
| 7,352,185 B1 | 4/2008 | Zens | |
| 7,557,578 B1 | 7/2009 | Zens | |
| 7,570,059 B2 | 8/2009 | Greim | |
| 8,063,639 B2 | 11/2011 | Zens | |
| 10,241,063 B2 | 3/2019 | Zens | |
| 10,241,165 B2 | 3/2019 | Zens | |
| 10,536,035 B2 * | 1/2020 | Joye | H02J 50/12 |
| 10,620,282 B2 | 4/2020 | Zens | |
| 10,656,107 B2 | 5/2020 | Zens | |
| 10,908,239 B1 | 2/2021 | Zens | |
| 11,090,481 B2 * | 8/2021 | Smith | A61M 60/523 |
| 2001/0033165 A1 | 10/2001 | Tomanek | |
| 2002/0171426 A1 * | 11/2002 | Hasegawa | G01R 33/3635 324/318 |
| 2006/0017438 A1 * | 1/2006 | Mullen | G01R 33/3635 324/318 |
| 2006/0173284 A1 * | 8/2006 | Ackerman | G01R 33/34084 600/422 |
| 2006/0176056 A1 * | 8/2006 | Doty | G01R 33/307 324/321 |
| 2009/0160442 A1 | 6/2009 | Mazurkewitz | |
| 2009/0237077 A1 | 9/2009 | Vaughan | |
| 2010/0156414 A1 | 6/2010 | Sakellariou | |
| 2010/0164645 A1 | 7/2010 | Kobayashi | |
| 2010/0256569 A1 | 10/2010 | Hancu | |
| 2011/0025326 A1 | 2/2011 | Zens | |
| 2012/0032678 A1 * | 2/2012 | Vaughan, Jr. | G01R 33/3415 324/318 |
| 2013/0063145 A1 * | 3/2013 | Wiggins | G01R 33/345 324/309 |
| 2014/0055138 A1 * | 2/2014 | Takegoshi | G01R 33/3403 324/322 |
| 2014/0055139 A1 * | 2/2014 | Takegoshi | G01R 33/30 324/322 |
| 2014/0057792 A1 | 2/2014 | Brey | |
| 2016/0231397 A1 * | 8/2016 | Mizuno | G01R 33/3621 |
| 2016/0291102 A1 * | 10/2016 | Matsunaga | G01R 33/307 |
| 2019/0025388 A1 * | 1/2019 | Shimizu | G01R 33/307 |
| 2020/0064419 A1 * | 2/2020 | Barry | G01R 33/323 |
| 2020/0321876 A1 * | 10/2020 | Mao | H02J 50/12 |
| 2022/0026510 A1 * | 1/2022 | Atalar | G01R 33/3628 |

FOREIGN PATENT DOCUMENTS

| | | |
|---|---|---|
| WO | WO2010/018535 | 2/2010 |
| WO | WO2013/108142 | 7/2013 |
| WO | WO2016179523 | 11/2016 |

OTHER PUBLICATIONS

Hoult, D.I., et al., "Use of Mutually Inductive Coupling in Probe Design", Concepts in Magnetic Resonance (Magnetic Resonance Engineering), vol. 15, (2002), pp. 262-285.

Hoult, D.I., et al., "Dual Surface Coil with High-B1 Homogeneity for deep organ MR Imaging", Magnetic Resonance Imaging, vol. 15, (1997), pp. 1199-1204.

King et al., MR Spectroscopy Using Multi=Ring Surface Coils, vol. 42 (1999) 655-664.

Kuhns PL et al., "Inductive coupling and tuning in NMR probes; Applications", Journal Magnetic Resonance, vol. 78, (1988), pp. 69-76.

Taber, B. Using Magnetic Coupling to Improve the 1H/2H Double Tuned Circuit, J. Magn. Reson. 259(2015) 114-120.

Tang, J. A. et al., Practical aspects of liquid-state NMR with inductively coupled solenoid coils, Magnetic Resonance in Chemistry, Jul. 27, 2010, (wileyonlinelibrary.com) DOI 10.1002/mrc.2651.

Van Hecke P, et al., "Double-Tuned Resonator Designs for NMR Spectroscopy", Journal Magnetic Resonance, vol. 84, (1989), pp. 170-176.

International Search Report, PCT/IB2016/000730, dated Nov. 11, 2016, 15 pages.

International Search Report, PCT/JP2017/000178, dated Oct. 17, 2017, 11 pages.

EPO Examination Report 16731648.8, regional phase in Europe of PCT/IB2016/000730, dated Apr. 24, 2018, 8 pages.

EPO Communication Art 94(3) EPC for Application No. 16731648.8, dated Nov. 15, 2018, 10 pages.

EPO Communication Art 94(3) EPC for Application No. 17719932.0, dated Jan. 14, 2019, 8 pages.

EPO Communication Art 94(3) EPC for Application No. 17719932.0, dated Jul. 1, 2020, 6 pages.

Japanese Office Action for Application No. 2017-553891, dated Oct. 9, 2018, 4 pages.

English translation of Japanese Office Action for Application No. 2017-553891, dated Oct. 9, 2018, 3 pages.

Japanese Office Action for Application No. 2018-526823, dated Mar. 11, 2019, 3 pages.

English translation of Japanese Office Action for Application No. 2018-526823, dated Mar. 11, 2019, 2 pages.

Chinese Office Action for Application No. 201680034553.6, dated Jul. 2, 2019, 7 pages.

English translation of Chinese Office Action for Application No. 201680034553.6, Jul. 2, 2019, 3 pages.

Chinese Office Action for Application No. 201680034553.6, dated Jun. 3, 2020, 7 pages.

English translation of Chinese Office Action for Application No. 201680034553.6, dated Jun. 3, 2020, 4 pages.

Chinese Office Action for Application No. 2017800041535.5, dated Nov. 25, 2019, 6 pages.

English translation of Chinese Office Action for Application No. 2017800041535.5, dated Nov. 25, 2019, 3 pages.

Chinese Office Action for Application No. 2017800041535.5, dated Jun. 22, 2020, 6 pages.

English translation of Chinese Office Action for Application No. 2017800041535.5, dated Jun. 22, 2020, 4 pages.

* cited by examiner

US 11,726,152 B1

SOLID SAMPLE MAGNETIC COUPLING HIGH RESOLUTION NUCLEAR MAGNETIC RESOLUTION PROBE AND METHOD OF USE

FIELD OF THE INVENTION

The present invention relates to methods and devices using magnetic coupling to monitor dual nuclei in solid sample high resolution nuclear magnetic resolution probes utilizing radio frequency (RF) signals.

BACKGROUND OF THE INVENTION

Structural elucidation of a compound, whether a synthesis product or an extract from a natural source generally requires a number of analytical techniques. Infrared spectroscopy, mass spectrometry, and nuclear magnetic resonance (NMR) spectroscopy can provide extensive chemical information. NMR can provide structural information and also information on both intermolecular and intramolecular dynamics. Applications of NMR range from determination of three-dimensional structures of large proteins to the analysis of very small amounts of products from combinatorial syntheses. Furthermore, NMR is a nondestructive analytical method.

High resolution NMR probes typically have an 'inner coil' for irradiation and detection of a first nuclear species, and a second larger coil, coaxial with the inner coil, for irradiation of one or more other nuclear species. The two coils are typically oriented 90° with respect to each other to minimize coupling between the two coils. Capacitive coupling has previously been used to form double-tuned high resolution NMR probes for $^1H$-$^2H$, $^{13}C$-$^{15}N$ and $^1H$-$^{19}F$.

In U.S. Pat. No. 3,789,832 to Damadian a method for imaging is described in which spatial localization is achieved by means of applying a spatially inhomogeneous static magnetic field where the signal is measured in the small homogeneous region of the static field. In U.S. Pat. No. 4,301,410 to Wind et al., a method is disclosed for spin imaging solids using NMR spectroscopy by rotating the sample about an axis at a particular angle to the NMR static external magnetic field, with a magnetic field gradient with a spatial distribution which is related to the sample spinning axis is synchronously rotated with the sample. In U.S. Pat. No. 4,654,593 to Ackerman, a method for NMR imaging uses a nonmagnetic moving object positioned in the field of a RF excitation coil and a magnetic field where the object is of a low conductivity so as to be substantially transparent to electromagnetic radiation at the NMR frequency and the nonmagnetic object is subjected to periodic motion while transverse magnetization is generated, and a short duration phase-encoding magnetic field gradient pulse is applied in a specified direction to the moving nonmagnetic object, where the magnetic field gradient is turned off and a free induct ion decay signal is detected. In U.S. Pat. No. 5,227,724 to Cory et al., a method for measuring the distribution of the extent of molecular transport along two orthogonal directions, and further for measuring the anisotropy of molecular transport is disclosed. In U.S. Statutory Invention Registration. No. H1218 to Cory et al., a method of NMR imaging where spatial coupling of the sample with a receiver device is varied using pulsed magnetic field gradients and the sample is moved relative to the receiver device, or the spatial coupling of the receiver device and the sample is electronically altered, is disclosed. Kuhns et al. describe the use of inductive coupling for series linked tuning of resonant circuits, J. Magnetic Resonance, "Inductive Coupling and Tuning in NMR Probes: Applications", 78 (1988) 69-76. Hoult and Tomanek describes the use of mutually inductive coils and investigates field strength, losses and signal to noise ratio, "Use of Mutually Inductive Coupling in probe Design", Concepts in Magnetic Resonance, 15(4) (2002) 262-285, Wiley Periodicals, Inc.

SUMMARY OF THE INVENTION

One of the issues with solid state Magic Angle Spinning (MAS) NMR is that because the stator is at the magic angle it is difficult to minimize circuit filling factor losses due to issues with the leads adjusting variable capacitors used to adjust the frequency of the parent coil. The leads connecting the variable capacitor to the parent coil have an inductance. The inductance of these leads does not produce a flux in the $B_1$ field that penetrates the sample. Hence the filling factor is reduced because not all the inductance of the circuit produces flux which couples to the sample. Even in a situation where the parent circuit has chip capacitors across the parent coil to minimize circuit losses the leads to the variable capacitor will produce signal degradation.

This problem has been solved by selecting an appropriate inductance parent coil and introducing an idler coil which can inductively couple to the parent coil by adjusting a variable capacitance of the idler coil. By coupling the idler coil to the parent coil in this manner a double resonance circuit can be provided without the disadvantages of prior art coils. Therefore, in various embodiments of the present invention, an inductive coupling coil can be used to achieve a double-tuned circuit. In various embodiments of the present invention, circuits use inductive coupling to achieve a double resonance circuit for $^1H$, $^{19}F$, $^{13}C$ (i.e., HFC) experiments where one of the three nuclei are observed and the other two decoupled or some subset of these experiments (i.e., $^1H\{^{19}F\}$ or $^{19}F\{^1H\}$).

BRIEF DESCRIPTION OF THE DRAWINGS

This invention is described with respect to specific embodiments thereof. Additional aspects can be appreciated from the Figures in which.

DETAILED DESCRIPTION OF THE INVENTION

Definitions

Figure 1:
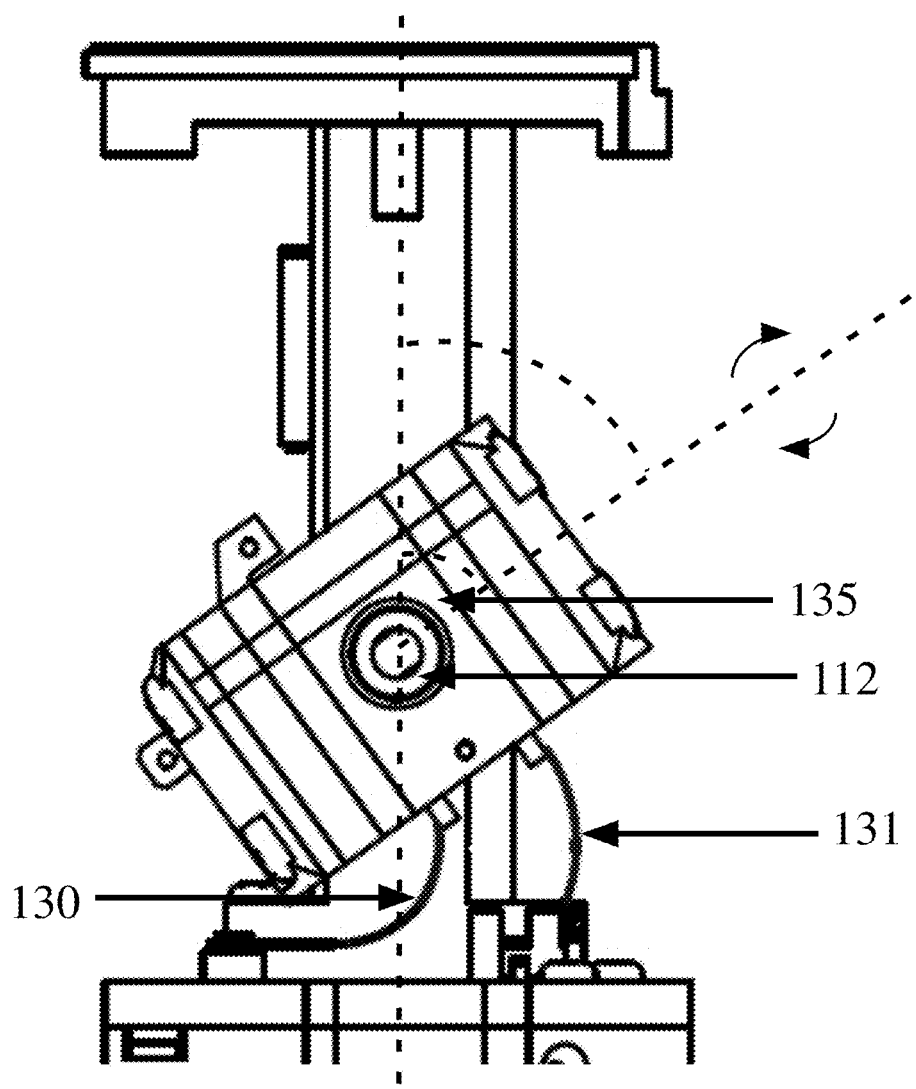
FIG. 1 is a schematic diagram of a prior art stator, where leads (130, 131) connect a variable capacitor (not shown) to a parent coil (not shown)

The transitional term 'comprising' is synonymous with 'including', 'containing', or 'characterized by', is inclusive or open-ended and does not exclude additional, unrecited elements or method steps.

The transitional phrase 'consisting of' excludes any element, step, or ingredient not specified in the claim, but does not exclude additional components or steps that are unrelated to the invention such as impurities ordinarily associated with a composition.

The transitional phrase 'consisting essentially of' limits the scope of a claim to the specified materials or steps and those that do not materially affect the basic and novel characteristic(s) of the claimed invention.

'Deployed' means attached, affixed, adhered, inserted, located or otherwise associated.

The phrase 'the NMR instrument' includes the magnet field characteristics of the NMR, e.g., the maximum magnet field intensity. The phrase 'the NMR probe' includes the size characteristics of the MAS solid sample probe.

The Quality Factor (Q) is defined as the ratio of the energy stored in a component to the energy dissipated by the component. The unloaded Q ($Q_u$) is the measured Q without the load.

A 'Cell' means a vessel used to contain one or more of a homogeneous or heterogeneous solid sample.

A filament means a wire with a diameter greater than approximately 20 micrometer and less than approximately one centimeter, where approximately is ±twenty (20) percent.

The phrase 'solid sample with resonances of two closely spaced nuclei' means that the sample contains elements which give rise to NMR resonances from two elements where the resonances are closely spaced, i.e., the distance between the two nuclei resonances in a 500 MHz magnetic field is less than approximately 50 MHz. In this circumstance, approximate means plus or minus twenty (20) percent.

The word 'simultaneous' means the detection of two voltages corresponding to a first nucleus resonance and a second nucleus resonance, where it is understood that the sign and the phase of the two voltages can be different.

The word 'excitation' describes the disruption of the alignment of spins of nuclei in a sample in a static magnetic field ($B_0$) which occurs by applying an RF pulse at the Larmor frequency of the spins perpendicular to the magnetic field ($B_1$). The word 'performance' means the signal to noise ratio of a circuit with respect to the parent mode(s). For example, the performance with respect to $^{19}F$ of a double resonance circuit monitoring $^{19}F/^{1}H$ is the signal to noise ratio of the circuit measuring the $^{19}F$ mode. Similarly, the performance with respect to $^{1}H$ of a double resonance circuit monitoring $^{19}F/^{1}H$ is the signal to noise ratio of the circuit measuring the $^{1}H$ mode. In an embodiment of the invention, the performance with respect to $^{19}F$ can be lowered (i.e., a lower signal to noise ratio) in order to improve the performance with respect to $^1$H, such that both the $^{19}$F and $^1$H modes can be simultaneously measured.

Coupling to various coils of different sizes and functions can be used to optimize the circuit. A parent coil, a coupling coil, a lock coil, and a detector coil can be solenoidal coils.

The word mode means a resonance in the circuit. The number of modes in a circuit cannot exceed the number of inductors.

The words or phrases 'coupling', 'coupling modes', 'detecting' or 'detecting modes' means selecting the capacitor 221 (C1) and adjusting the frequency using the variable capacitor 221 and/or adjusting the variable inductors 1171/1172 (L3/L4) such that the idler coil 211 couples to the parent coil 210, where the parent coil capacitor 220 (C2) remains fixed. The critical coupling is necessary for matching the resistance to a fifty (50) Ohm coax. In various embodiments of the invention, the resistance can be matched to other resistance coax. In an embodiment of the invention, the resistance can be coupled to seventy five (75) Ohm coax. In various embodiments of the invention, seventy seven (77) Ohm coax gives minimum loss. Means of adjusting the variable capacitor 221 include a tuning capacitor, a trimmer variable capacitor, a sliding band capacitor, and operational amplifiers and associated circuit components as known in the art to adjust the capacitance of the variable capacitor 221. Means of adjusting the variable inductors 1171/1172 include a metallic core variable inductor, (e.g. a silver core variable inductor, a copper core variable inductor and the like), a carbon core variable inductor, an air core variable inductor, a sliding variable inductor, and operational amplifiers and associated circuit components as known in the art to adjust the inductance of the variable inductors 1171/1172.

The phrases 'parent coil', 'primary coil', or 'sample coil' means the inductor constructed to observe the parent resonance. The parent coil can be inserted into the stator assembly.

The phrase 'idler coil' or 'loop gap resonator' means the idler coil and inductor, constructed to couple with the parent coil. The idler coil can slide and/or fit around the parent coil and the stator assembly for example as depicted in FIG. 3B.

The phrase 'inductive coupling loops' means (i) the parent coil 210 and the idler coil 211, (ii) the coupling coil 1187, and the variable inductor 1171 and (iii) the coupling coil 1188 and the variable inductor 1172.

The phrase 'sample coupling coil' refers to an inductive coil. The phrase 'sample coupling coil circuit' refers to an inductive coil and a capacitor. A sample coupling coil can be used for detecting the fluctuating signal that is in resonance with a signal from a sample. In circumstances where there is no lower threshold, a first distance is defined between the sample coupling coil and the one or more inductive coupling loops. A resonant circuit is an electric circuit which has oscillating currents which are stored as energy (i.e. electric field and magnetic field) and the complex impedance of the capacitor and inductor are each near zero. The only losses in the circuit are from the pure resistive parts of the components, the inductor L and the capacitor C. Inductive coupling is the near field wireless transmission of electrical energy between two magnetically coupled coils.

An idler coil can be used to enable a tuned condition between the parent coil and the idler coil. The idler coil can be used to enable a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition at least two signals. The idler coil cart be used to observe a tuned condition between for example $^{13}$C/$^{27}$Al, $^1$H/$^{19}$F, $^{27}$Al/$^{65}$Cu, $^{17}$O/$^{63}$Cu, and $^{63}$Cu/$^{65}$Cu.

The word 'susceptibility' refers to the magnetic susceptibility of the materials used to construct the probe to preserve the $B_0$ homogeneity of the magnet in the sample region. Here 'Zero Susceptibility' means very low volume susceptibility.

The phrase the 'inductive coupling loop' means an inductive coupling coil used to match to a minimal reflective power (e.g., to fifty (50) ohm coax).

Figure 10:
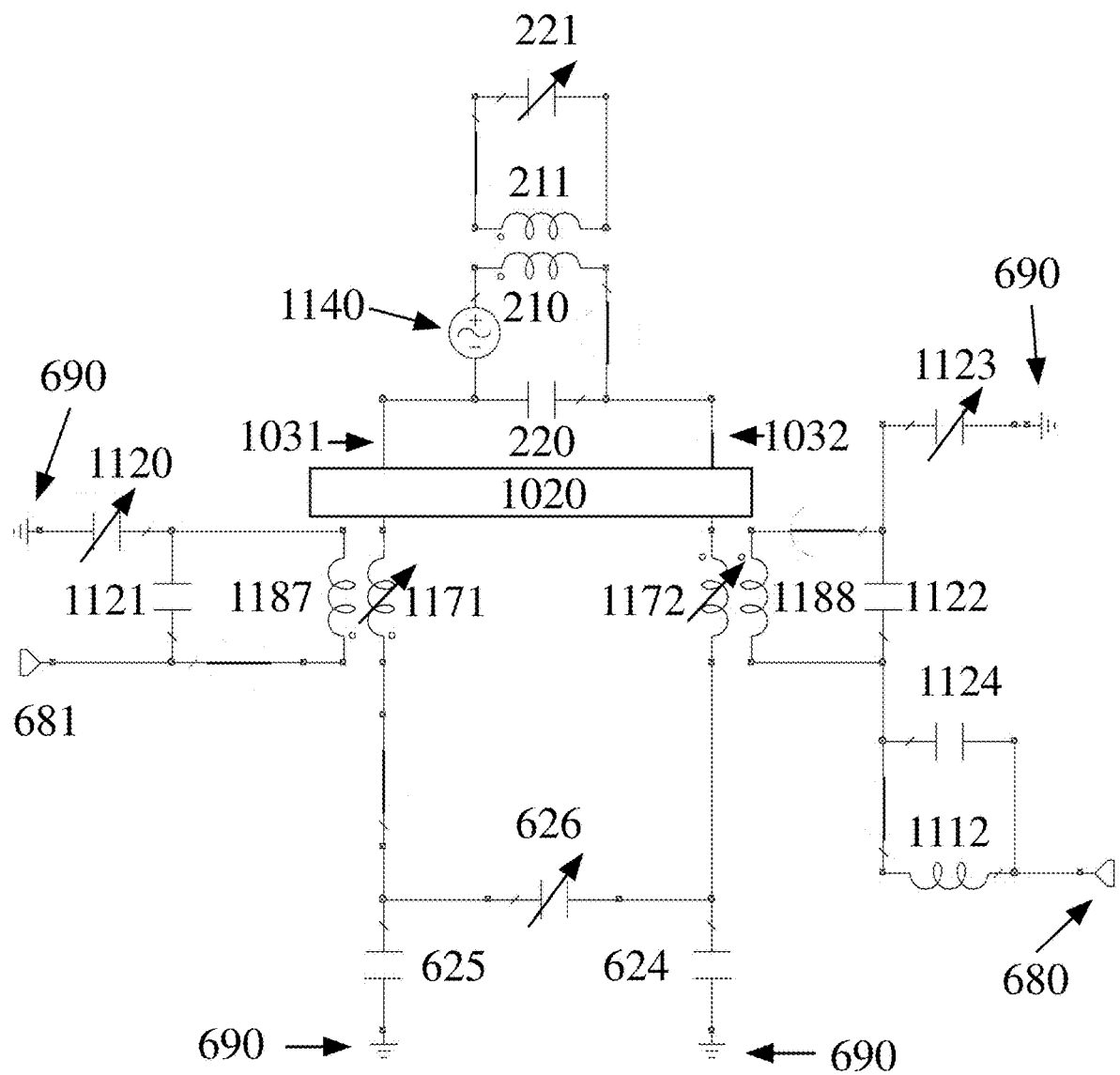
FIG. 10 is a schematic drawing of a circuit showing the parent coil (210) and an idler coil 211 in a first region and two coupling coils in a second region.

The phrase 'multiply tuned resonance circuit' means two (2) or more connected (e.g., including inductively coupled) tuned circuits (see e.g., FIG. 10, with ports 680 and 681). In an embodiment of the invention, a doubly tuned circuit consists of for example X-$^{19}$F, where X=$^1$H, $^{31}$P, $^{13}$C, and $^{15}$N. In an alternative embodiment of the invention, a doubly tuned circuit consists of for example X-$^1$H, where X=$^{19}$F, $^{31}$P, $^{13}$C, and $^{15}$N. In an embodiment of the invention, a triply tuned circuit consists of for example X-$^{19}$F, $^{13}$C, where X=$^1$H, $^{31}$P, and $^{15}$N. In an alternative embodiment of the invention, a triply tuned circuit consists of for example X-$^1$H, $^{13}$C, where X=$^{19}$F, $^{31}$P, and $^{15}$N.

The phrase 'lower insulator' means a partition between the region that houses the parent circuit and the area outside of the parent coil region. The secondary circuits are located outside the parent coil region. In various embodiments of the invention, some NMR probes, i.e. solids probes, do not use a formal lower insulator partition.

The phrase 'Circuit Fill Factor (CFF)' means for a specific mode, k, the definition of CFF referred to reference inductor is $$CFF_{k,a} = \frac{L_a i_a^2}{\sum_{j=1}^{N} L_j i_j^2},$$

where a is the sample inductor, i is the current in the inductor, the j indices identify specific inductors, and it is implicit that the current values are for the kth mode. It is clear that this definition does not accommodate the presence of mutual inductance. From the definition of CFF it is clear that having more inductors in the circuit dilutes the signal to noise ratio of the multiply tuned probe circuit. For probe circuits with multiple ground points there exist the question of what is the common ground point. If the ground points are not at the same potential as the common ground point then each ground point is essentially and inductor to that common ground point and hence the potential to dilute the CFF of the circuit.

The phrase 'electrically connected' means a connection where electrons will flow (i.e., in a circuit with a capacitor electrons do not flow across the capacitor). A parent coil is not electrically connected to an idler coil. A parent coil is not electrically connected to a coupling coil. A circuit is in electrical connection to all the components in the circuit. A parent coil circuit (see e.g., FIG. 5 and FIG. 10) is in electrical connection with a fixed capacitor 220 and a parent coil 210. An idler coil circuit (see e.g., FIG. 5 and FIG. 10) is in electrical connection with an idler coil 211 and a variable capacitor 221.

Figure 15:
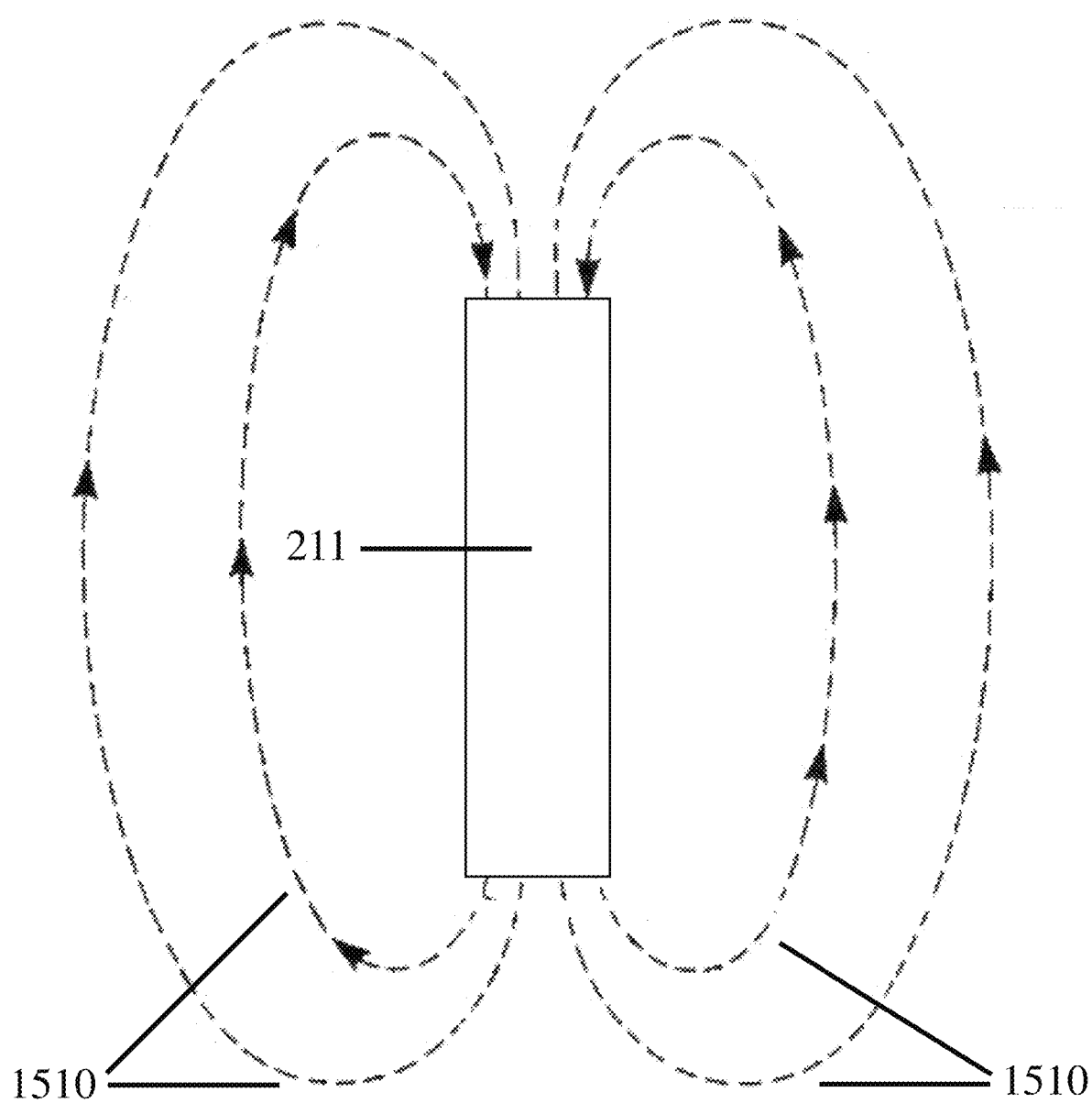
FIG. 15 shows the inductor field lines 1510 surrounding the parent coil 210 (not shown) located inside the idler coil 211, according to various embodiments of the invention.

The phrase 'the RF field symmetry is minimally affected by the position of the idler coil' means that a 2D plot of the inductor field lines 1510 show the right side field lines being the approximate mirror images of the left hand side field lines, as shown in FIG. 15. In this circumstance, approximate means that the left side and the right side are mirror images superimposable within a twenty (20) percent tolerance.

The RF-homogeneity of the parent coil is also a concern when the coupling loop of the matching network is close in proximity to the parent coil. This is particularly true for solenoid coils used in solid state NMR probes where a coupling loop can distort the $B_1$ field of the coil on one end of the NMR parent coil. Ensuring the RF-homogeneity of the parent coil is a major advantage of secondary magnetic coupling, as per embodiments of the invention.

The phrase 'resonant condition' or 'resonant condition for two closely spaced nuclei' when used in the phrase 'interaction between the parent coil 210 and the idler coil 211 is adjusted to a resonant condition' means when at a given coupling constant the frequency is adjusted to observe both the first mode and the second mode, i.e., if the first mode is $^{19}F$ and the second mode is $^{1}H$, then the frequency is adjusted half way between the difference between the resonant frequencies of $^{19}F$ and $^{1}H$, e.g., for a 11.6 Tesla 500 MHz magnet, the signal is adjusted half way between 470 MHz and 500 MHz, i.e. 485 MHz.

The word 'adjusted' when used in the phrase 'interaction between the parent coil 210 and the idler coil 211 is adjusted to a resonant condition' means the CFF for the circuit would show greater than approximately ninety (90) percent of the energy resides in the parent coil 210. Approximately in this range means plus or minus ten (10) percent.

The word 'optimally' when used in the phrase 'interaction between the parent coil 210 and the idler coil 211 is optimally adjusted to a resonant condition' means when at a given coupling constant the frequency is adjusted based on an experimentally observed CFF for the circuit, e.g., if the first mode is $^{19}F$ and the second mode is $^{1}H$, the energy of the resonance of $^{19}F$ is approximately equal the energy of the $^{1}H$. In this circumstance, approximately means that the efficiency is plus or minus ten (10) percent.

Absent express recitation to the contrary, the term 'approximately' means a nominal value plus or minus ten (10) percent thereof.

An NMR probe includes a complex array of field shimming or field improving devices to correct for magnetic field in-homogeneities. The probe can be a removable cylinder which contains: the sample tube holder and air spinner outlets; the radiofrequency coils for signal detection, spin irradiation, and locking of the magnetic field; the electronics, Dewar, gas inlets and outlets for cooling and heating of the sample; tuning coils for fine adjustments of the magnetic field, and coils for producing precise field gradients. For the most common nuclei, the magnetic moments are: $^{1}H$ µ=2.7927, $^{2}H$ µ=0.8574, $^{19}F$ µ=2.6273, $^{31}P$ µ=1.1305 & $^{13}C$ µ=0.7022. These moments are in nuclear magnetons, which are 5.05078×10-27 JT. The energy difference between two spin states is less than 0.1 cal/mole. The spins in the NMR experiment can be detected by a coupling coil. A coupling coil can detect the fluctuating signal with a circuit that is in resonance with the signal from the sample. That is, the circuit contains an inductor and capacitor which resonates at the Larmor frequency (resonance frequency) of the spins in the sample. The inductor usually encloses the NMR sample in a manner which closely approximates the sample volume. The signal from the must be matched to an impedance matched detection line so that the excitation and detection of the signal can be accomplished with minimal loss. NMR coupling coils can be designed in many shapes and forms. From simple solenoids to complex built in capacitance coil arrays. Often more than one spin type or nucleus is excited or detected during the course of an experiment. Multiple coils can be used to accomplish this and the region around the sample can become space intensive in terms of the number of objects required to undertake the signal detection in the NMR experiment. Due to space considerations the sample coil surrounding the sample is often resonated such that it has multiple modes. However, the number of modes cannot exceed the number of inductors. The practice of employing variable inductors 1171, 1172 in a second region helps reduce the number of coupling coils in the sample region of the NMR probe. For a typical multiple resonance probe that requires a lock resonance and three other resonant frequencies for the NMR experiment, this reduces the number of coils in the sample region from four to two. However, this reduction in the number of coupling coils doesn't come without a loss in signal to noise ratio. Accordingly, circuit efficiency remains very important. Further, additional resonances in the circuit can originate when the inductors don't have a common ground point in the circuit. These additional resonances reduce the circuit fill factor.

An NMR probe can include a sample, a parent detection coil/associated circuitry, an idler coil/associated circuitry, a pulsed field gradient, a shield, one or more coupling coils/associated circuitry, supports for the one or more coupling coils, supports for the one or more inductors, one or more fixed capacitors, one or more variable capacitors and a stator to support the sample, the parent detection coil and idler coil. A perturbation of the magnetic field or the flux generated by the sample coil will reduce the signal to noise ratio. Accordingly, minimizing the components in the sample region of the NMR probe can reduce perturbations of the magnetic field ($B_0$), the RF homogeneity and accordingly increase the signal to noise ratio.

As known in the art, the term S11 refers to the forward reflection of a first input port, which is a measure of the impedance match. The term S22 refers to the forward reflection of a second input port, which is a measure of the impedance match.

Figure 8:
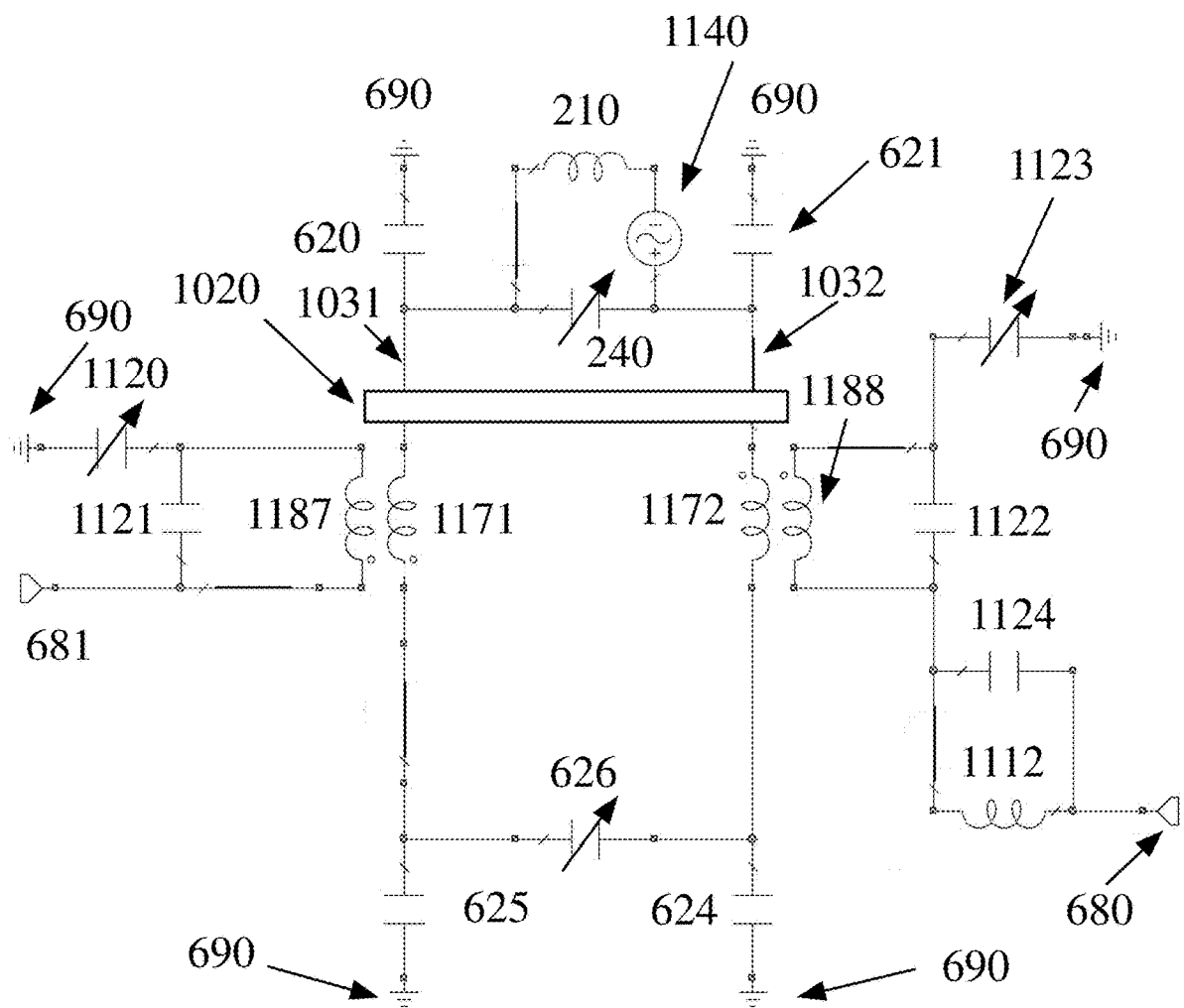
FIG. 8 is a schematic drawing of a prior art circuit showing the parent coil in a first region and two coupling coils in a second region.

The circuits in FIG. 8 and FIG. 10 show inductively coupled double tuned circuits, e.g., 1187/1188 circuit which utilize two (2) coupling coils. The circuit in FIG. 8 is suitable for resonances in which there is a low frequency and a high frequency mode, e.g., a $^{13}C$ 1187/$^{1}H$ 1188. In contrast, FIG. 10 can be used for resonances which are close spaced, e.g., a $^{1}H$ 1187/$^{19}F$ 1188 circuit. For a two-mode circuit like the double tuned e.g., $^{1}H/^{19}F$ circuit shown in FIG. 8 and FIG. 10 all the elements of the circuit share the current associated within a given mode. Unexpectedly, it can be possible to couple inductively to any inductor in the circuit shown in FIG. 10 provided there is sufficient current to match the circuit mode to approximately 50 Ohms. Equation 1 shows the relationship between the mutual inductance $M_{a,b}$, the two coils $L_a$, $L_b$ and the coupling constant K.

$$M_{a,b} = K*(L_a*L_b)^{1/2} \qquad \text{Equation 1}$$

In the circuit shown in FIG. 10 the idler coil 211 and the parent coil 210 can be inductively coupled to match the coupling coils to e.g., $^{13}C$ 1187/$^{1}H/^{19}F$ 1188. Importantly, in the circuit shown in FIG. 10 the inductive coupling loops exhibit very little loss.

The circuit shown in FIG. 10 has several advantages, a) the coupling loops don't interfere with the coils in the sample region of the probe, b) RF distortion of the parent coil B field from the idler coil 211 is eliminated by fixing the position of the idler coil 211 relative to the parent coil 210, c) the slitting coupling loops don't have to be susceptibility corrected due to their proximity to the parent coil 210 since they are not located in the sample region of the probe, d) RF distortion of the parent coil $B_1$ field from the coupling loop is eliminated and e) the coupling loops don't have to be susceptibility corrected due to their proximity to the parent coil since they are not located in the sample region of the probe.

$$SNR \propto \sqrt{(SFF*CFF_{k,a}*Q_k)} \qquad \text{Equation 2}$$

To analyze the circuits shown in this paper a CFF analysis was conducted. The CFF can be shown to be part of the SNR, see Equation 2, where SFF is the sample fill factor, CFF is the circuit fill factor for the sample inductor (a) for the observed mode (k) and $Q_k$ is the Q of the kth mode. Absent indication to the contrary, a Q value of 400 is assigned for all the inductors shown in FIG. 2, FIG. 5, FIG. 8, FIG. 10, FIG. 13, and FIG. 14.

In the following description, various aspects of the present invention are described. However, it will be apparent to those skilled in the art that the present invention can be practiced with only some or all aspects of the present invention. For purposes of explanation, specific numbers, materials, and configurations are set forth to provide a thorough understanding of the present invention. However, it will be apparent to one skilled in the art that the present invention can be practiced without the specific details. In other instances, well-known features are omitted or simplified in order not to obscure the present invention.

Parts of the description are presented in data processing terms, such as data, selection, retrieval, generation, and so forth, consistent with the manner commonly employed by those skilled in the art to convey the substance of their work to others skilled in the art. As is well understood by those skilled in the art, these quantities (data, selection, retrieval, generation) can take the form of electrical, magnetic, or optical signals capable of being stored, transferred, combined, and otherwise manipulated through electrical, optical, and/or biological components of a processor and its subsystems.

Various operations are described as multiple discrete steps in turn, in a manner that is helpful in understanding the present invention; however, the order of description should not be construed as to imply that these operations are necessarily order dependent.

Various embodiments are illustrated in terms of exemplary classes and/or objects in an object-oriented programming paradigm. It will be apparent to one skilled in the art that the present invention can be practiced using any number of different classes/objects, not merely those included here for illustrative purposes.

Aspects of the invention are illustrated by way of example and not by way of limitation in the figures of the accompanying drawings in which like references indicate similar elements. It should be noted that references to 'an' or 'one' embodiment in this disclosure are not necessarily to the same embodiment, and such references mean at least one.

There remain encumbrances to the employment of inductively coupled probes to the NMR technique for a variety of samples and various experimental conditions. Dual probe circuits do not utilize inductive coupling to achieve the double-tuned circuit but rather use capacitive coupling to achieve the desired tuning properties.

Figure 3A:
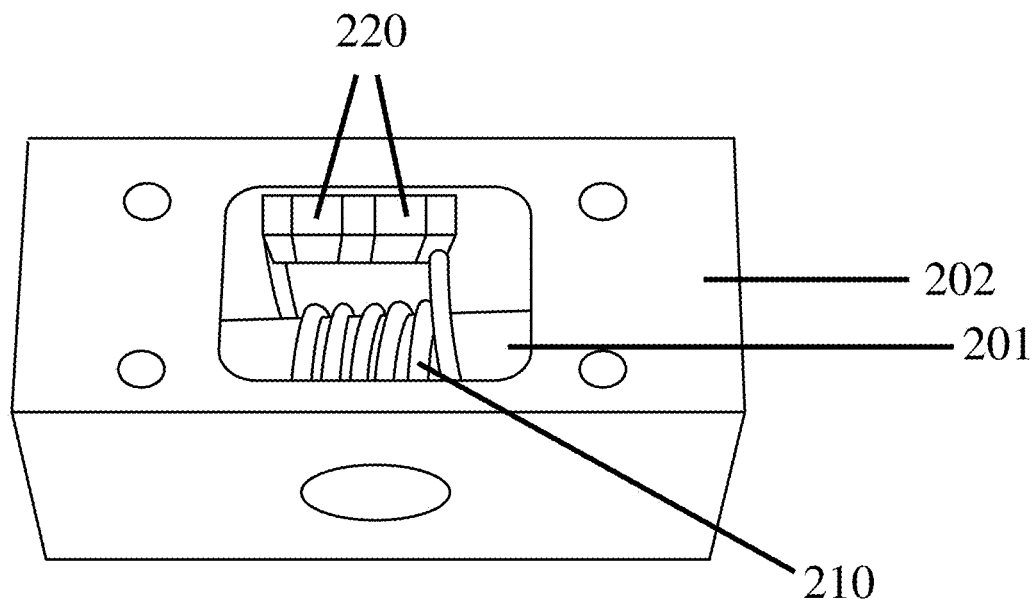
FIG. 3A is a schematic diagram showing the parent coil in a stator assembly with resonating chip capacitors in which a solid sample can be positioned, according to an embodiment of the invention.
Figure 3B:
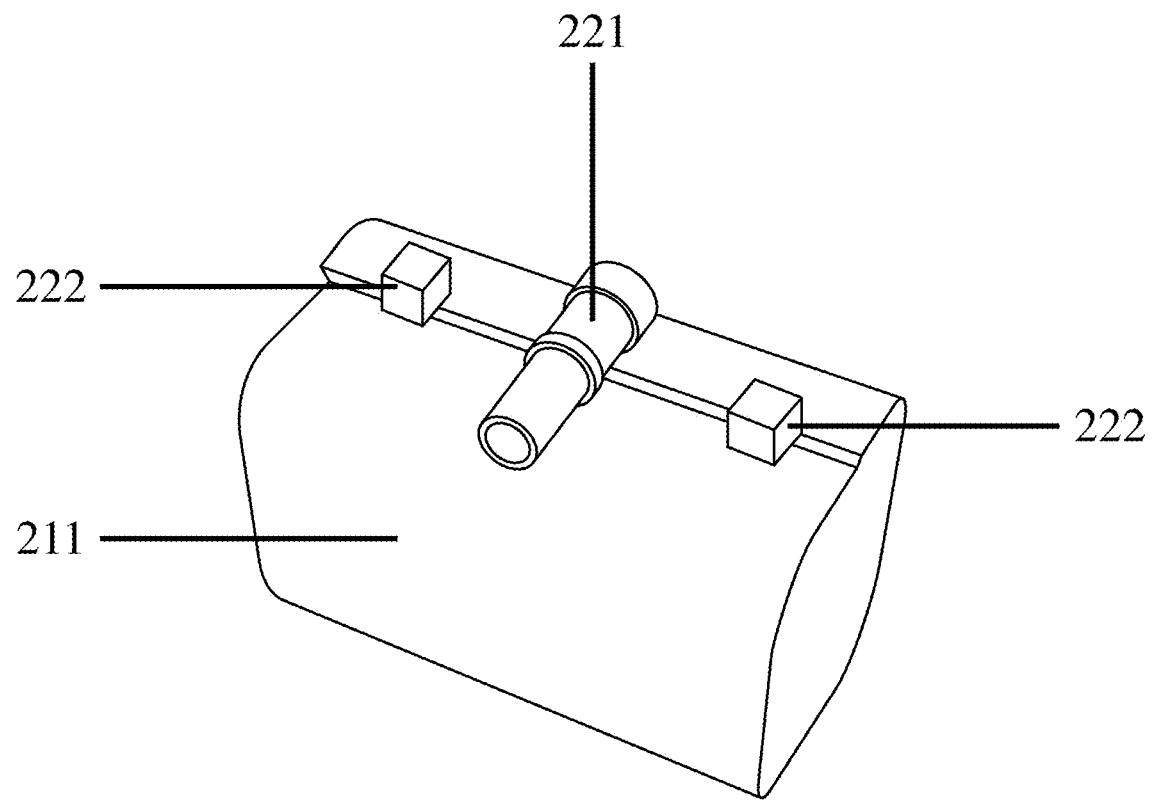
FIG. 3B is a schematic diagram showing an idler coil that fits around the stator assembly shown in FIG. 3A, according to an embodiment of the invention.

FIG. 3A is a schematic diagram showing the parent coil 210 in a stator assembly 202 with resonating chip capacitors 220 in which a solid sample 201 can be positioned. FIG. 3B is a schematic diagram showing an idler coil 211 that fits around the stator assembly 202 shown in FIG. 3A. The tune variable capacitor 221 can be manually adjusted. The chip capacitors 222 can be used to resonate the idler coil.

Figure 4:
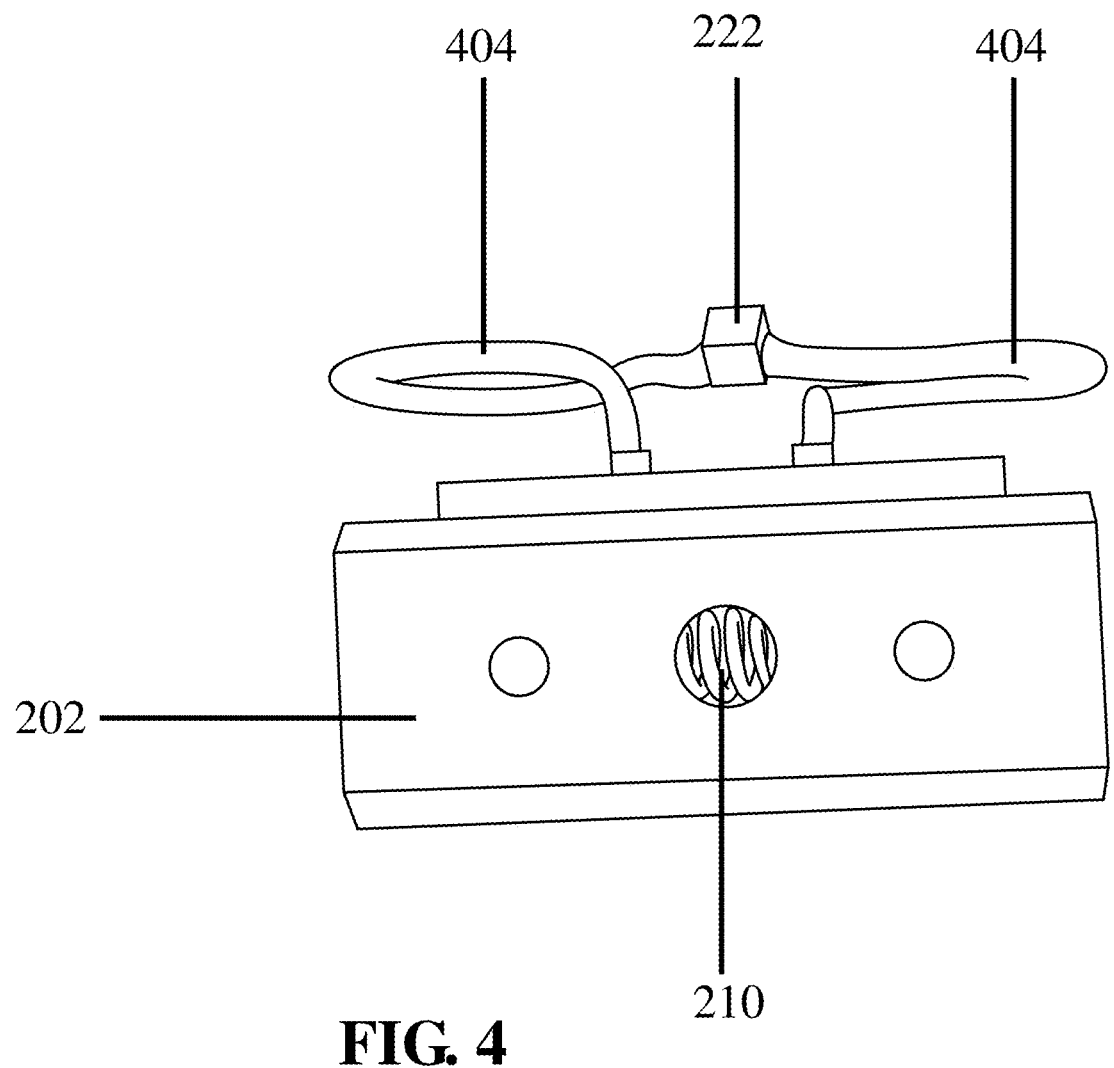
FIG. 4 is a schematic diagram showing the parent coil 210 in the stator 202 with X-traps 404 and an X-Tune chip 222, according to an alternative embodiment of the invention.

FIG. 4 is a schematic diagram showing the parent coil 210 in the stator 202 with X-traps (inductors) 404 and an X-Tune chip (capacitor resonating the second resonance) 222 used to resonate the double tuned circuit. FIG. 4 is an alternative embodiment of the invention to that shown in FIG. 3A, where the idler coil 211 shown in FIG. 3B can be slid over the stator 202 shown in FIG. 4.

Figure 2:
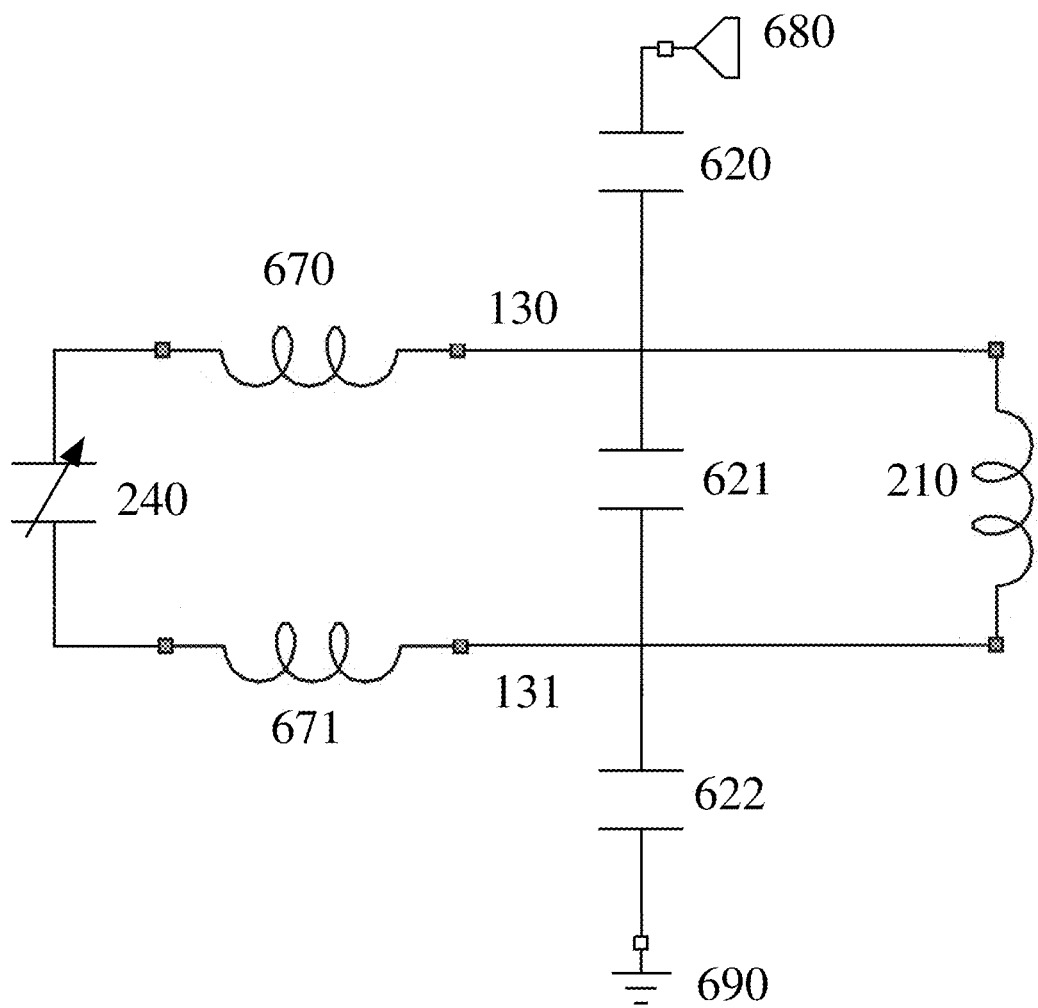
FIG. 2 is a schematic drawing of a prior art circuit showing the parent coil (210), the leads 130, 131 which are also represented by the inductors 670, 671 connecting to the variable capacitor 240, as per the prior art stator shown in FIG. 1.

FIG. 2 is a schematic drawing of a prior art circuit showing the parent coil inductor 210 and the leads 130, 131 which are represented by the inductors 670, 671 connecting to the variable capacitor 240 to the parent coil 210, as per the prior art stator shown in FIG. 1. Here the variable capacitor 240 can be used to tune to a resonance, where L1 is the inductance of the parent coil 210. In an embodiment of the invention, the idler coil inductor 211 can be positioned in a fixed location relative to the parent coil 210 and the variable capacitor 240 can be used to adjust the coupling between the coils (L2 and L1) to create the two modes at the desired frequencies for $^1H$ and $^{19}F$ which can be measured at port 680. However, these leads 130, 131 have an inductance 670, 671. The inductance 670, 671 of these leads 130, 131 does not produce flux (B1) that penetrates the sample. Hence, the filling factor is reduced because not all of the inductance of the circuit produces flux which couples to the sample. Even though the circuit has chip capacitors 620, 621 and 622 (where capacitors 620, 621 and 622 can be variable) across the sample coil (connecting to the ground 690) to minimize circuit losses, the leads to the variable capacitor will produce signal degradation.

Figure 5:
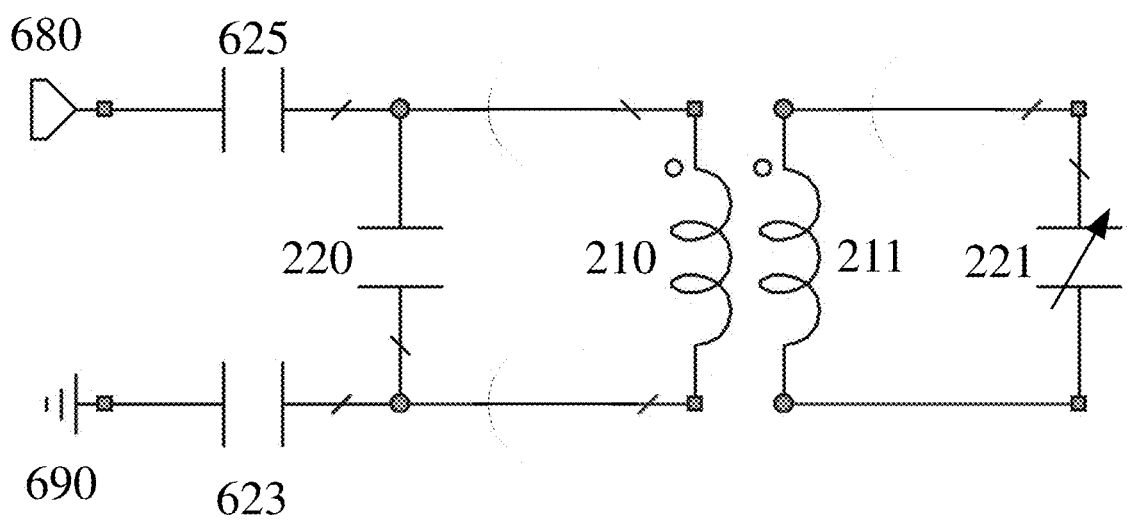
FIG. 5 is a schematic drawing of a circuit showing the parent coil circuit including the parent coil 210 and the fixed capacitor 220 and the idler coil circuit including the idler coil 211 and the variable capacitor 221, according to an embodiment of the invention.

An example of a double-tuned $^1H$, $^{19}F$ (H/F) circuit according to an embodiment of the present invention is shown in FIG. 5. Here the idler coil 211 (L1) can be positioned in a fixed location relative to the parent coil inductor 210 (L2) where a fixed capacitor 220 is chosen such that the two coils (L1 and L2) are close to resonating near the halfway point between the observed frequency for $^1H$ and $^{19}F$ and the variable capacitor 221 can be used to adjust the coupling between the coils (L1 and L2) to further increase the resonance at the half way point creating the two modes at the desired frequencies for $^1H$ and $^{19}F$ which can be measured at port 680. For example, in FIG. 5 the ground bus 690 to the parent coil 210 is capacitively coupled through 623 to the circuit of FIG. 5. Further, the signal output port 680 is capacitively coupled via capacitor 625 to the circuit of FIG. 5.

Figure 6A:
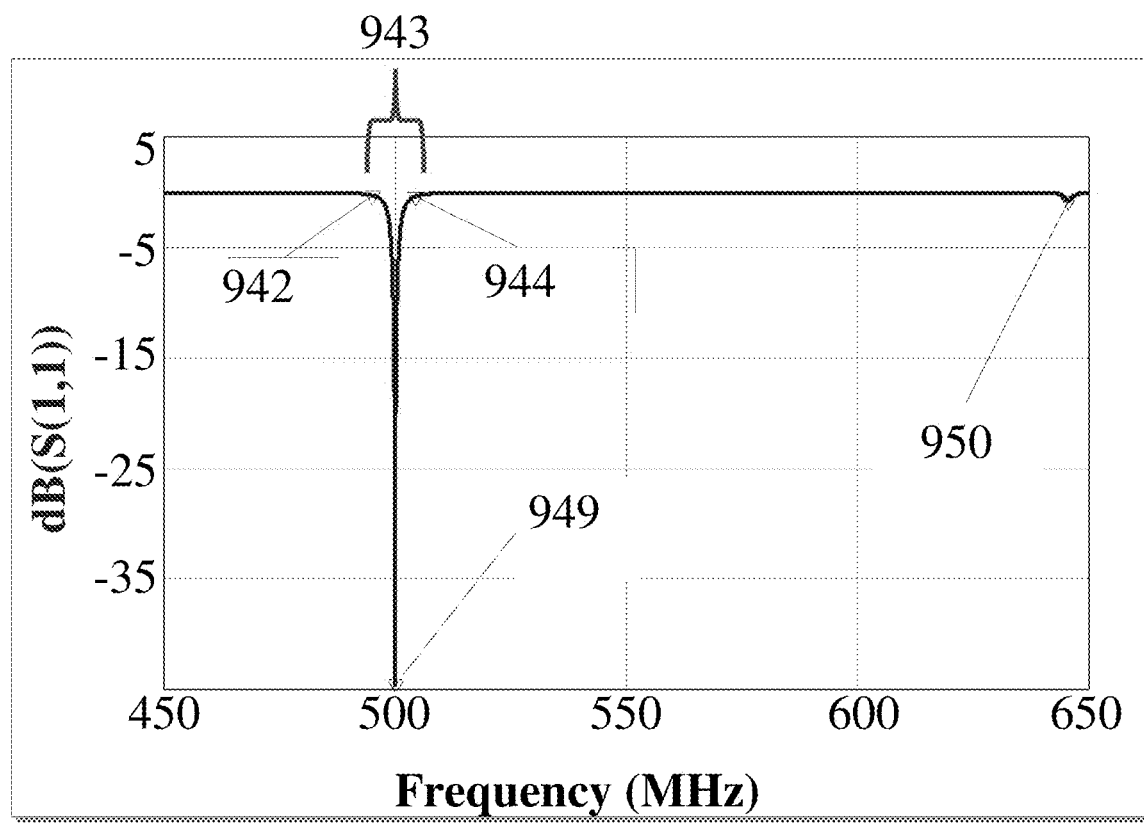
FIG. 6A is the simulated S11 plot for the circuit shown in FIG. 5 where the variable capacitor 221 of the idler coil 211 is adjusted such that the Circuit Fill Factor (CFF) for the circuit reflects the energy disproportionately in one nuclei resonance as shown in FIG. 6B, according to an embodiment of the invention.
Figure 6B:
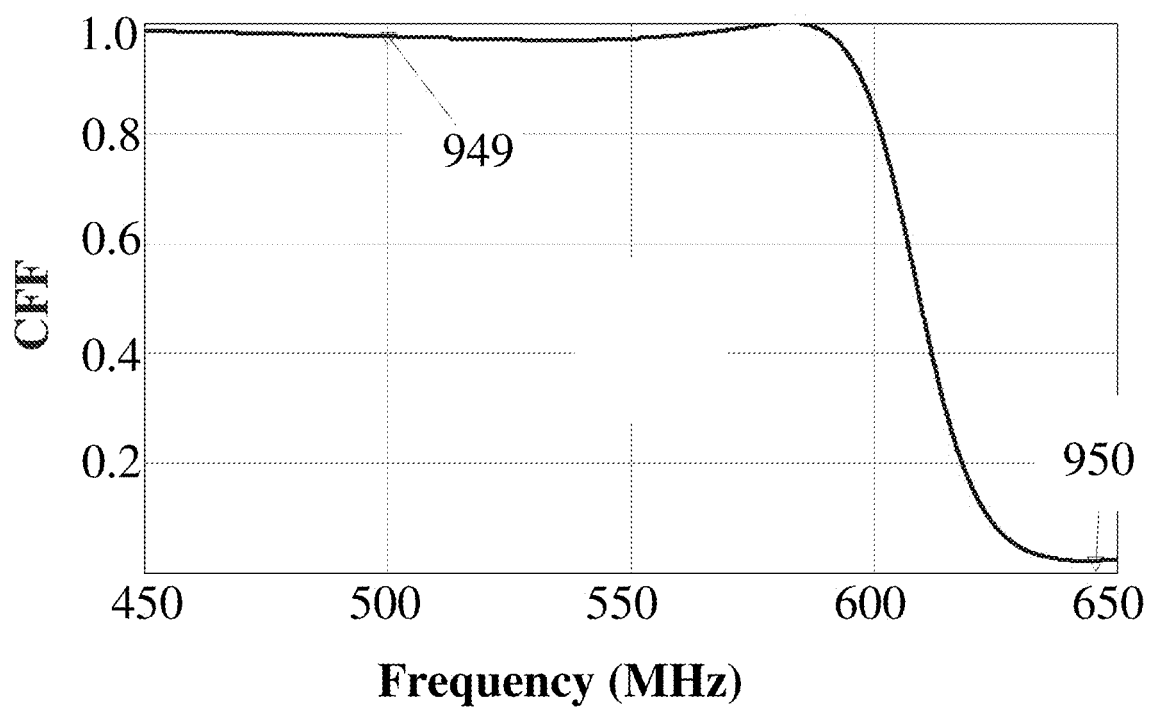
FIG. 6B is the simulated CFF for the circuit shown in FIG. 5 with the variable capacitor 221 of the idler coil circuit adjusted as in FIG. 6A, according to an embodiment of the invention.

FIG. 6A shows the simulated S11 plot for the circuit shown in FIG. 5 where the idler coil 211 is inductively coupled to the parent coil 210 and the $^1H$ resonance minimum at 500 MHz shown at 949 predominates compared to the idler minimum at 645.4 MHz shown at 950. In FIG. 6A most of the energy can reside in the parent inductor 949. In FIG. 6A a 10 MHz 943 frequency range is shown (495-505 MHz) 942-944. FIG. 6B is a plot of the simulated CFF for the parent coil 210 where the idler coil 211 is adjusted as shown for FIG. 6A in the circuit shown in FIG. 5. In FIG. 6B the $^1H$ resonance at 500 MHz is shown at 949 where greater than 98% of the energy resides and the idler frequency at 645 MHz is shown at 950 where less than 2% of the energy resides. See also e.g., Bowyer et al., Using magnetic coupling to implement $^1H$, $^{19}F$, $^{13}C$ experiments in routine high resolution NMR probes, J. Magn. Reson, 261, (2015) 190-198, which is herein incorporated by reference in its entirety and for all purposes.

Figure 7A:
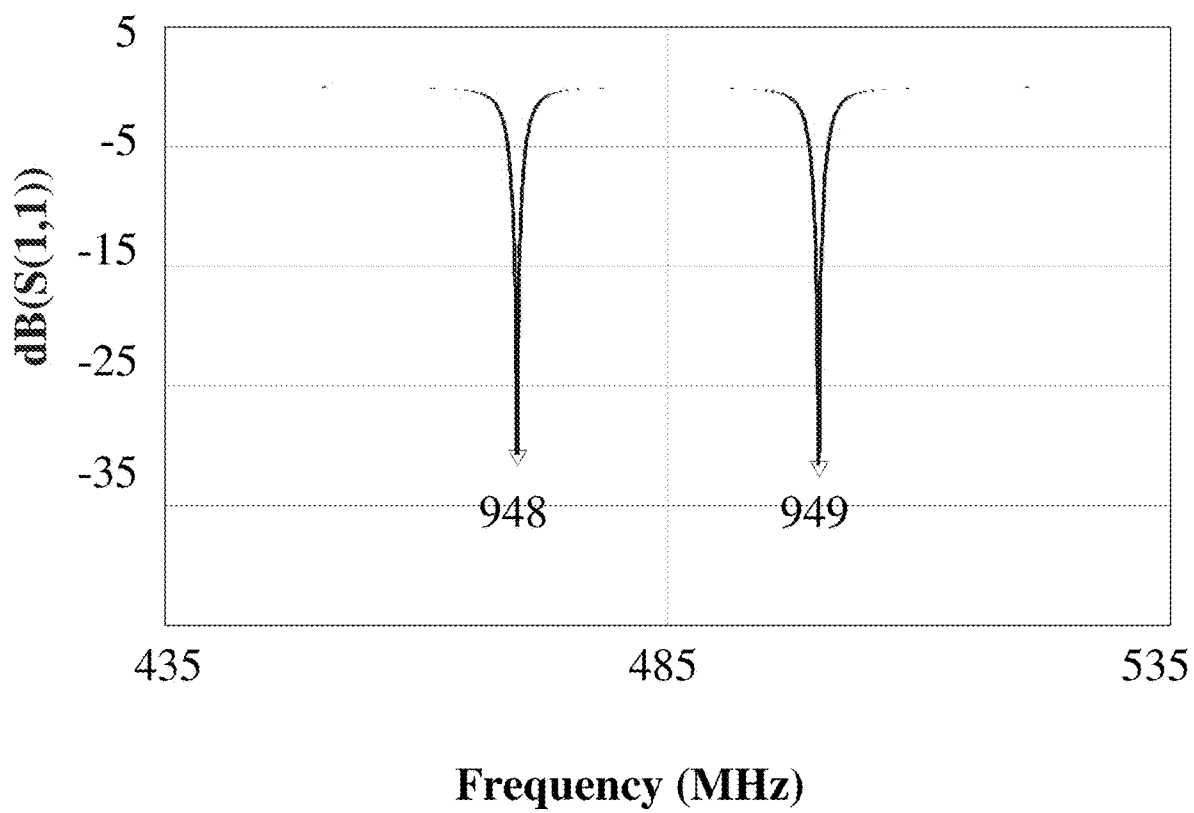
FIG. 7A is the simulated S11 plot for the circuit in FIG. 5 in which the variable capacitor 221 of the idler coil circuit is adjusted to adjust the frequency approximately midway between 470 MHz and 500 MHz, according to an embodiment of the invention.
Figure 7B:
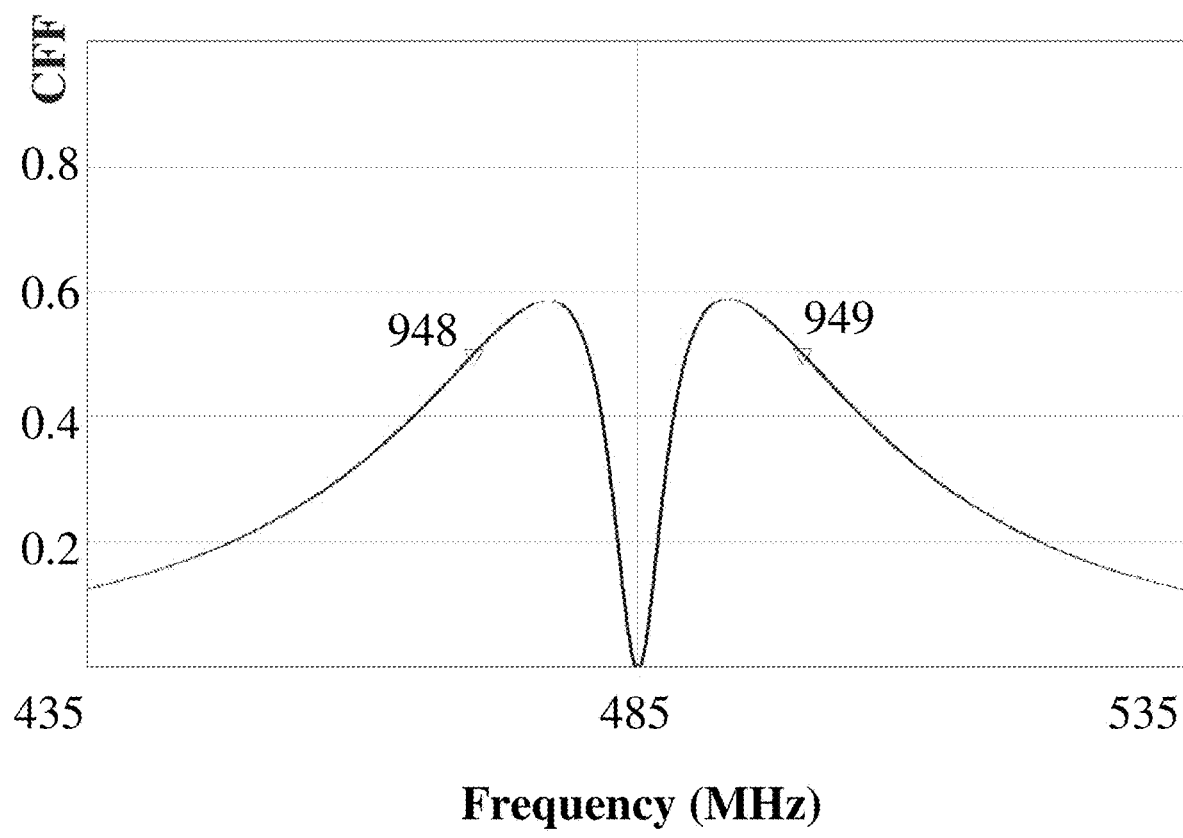
FIG. 7B is the simulated CFF for the parent coil 210 where the idler coil 211 in the circuit in FIG. 5 with the variable capacitor adjusted as in FIG. 7A, according to an embodiment of the invention.

FIG. 7A shows the simulated S11 plot for the circuit shown in FIG. 5 where the idler coil 211 is adjusted to resonate close to the desired parent coil frequency (approximately 500 MHz) such that the interaction between the parent coil 210 and the idler coil 211 is optimally adjusted to a resonant condition. In FIG. 7A, the aim of having two observable modes is achieved with the $^{19}$F resonance minimum at 470 MHz (−30.77 dB) shown at 948 is comparable to the $^1$H minimum at 500 MHz (−31.69 dB) shown at 949. FIG. 7B is the simulated CFF plot for the parent coil 210 and idler coil 211 in the circuit in FIG. 5 with the variable capacitor 221 of the idler coil circuit adjusted as in FIG. 7A. In FIG. 7B the $^{19}$F resonance at 470.1 MHz is shown at 948 (CFF=0.5003) and is comparable to the energy in the $^1$H resonance at 500 MHz (CFF=0.4978) shown at 949. The CFF sum energy is 0.9981.

Previously, an idler coil position is adjusted relative to the parent coil to adjust the inductive coupling between the idler coil and the parent coil. However, NMR analysis of solid samples is improved by spinning the samples at a magic angle in order to average orientation dependent interactions. Adjusting the position of an idler coil relative to the parent coil to couple or decouple would interfere with the averaging occurring at the magic angle. FIG. 1 is a schematic diagram of a prior art stator, where leads (130, 131) connect a variable capacitor to a parent coil (not shown). The stator 112 is aligned relative to the magnetic field at approximately the magic angle 135 of 54.7 degrees. Therefore, the idler coil is held in a fixed position such that the magnetic field lines 1510 of the parent coil remain symmetrical, as shown in FIG. 15. Careful choice of the fixed position of the idler coil 211 relative to the parent coil 210, and the fixed capacitor 220 capacitance can result in a situation where the variable capacitor 221 can be used to adjust the inductive coupling. In an embodiment of the present invention, it was possible to adjust the variable capacitor 221 such that the detection of specifically one of the two modes was optimized, see FIG. 6A. In an alternative embodiment of the present invention, it was possible to adjust the variable capacitor 221 such that the detection of both of the two modes was optimized, see FIG. 7A (showing a plot of the simulated S11 plot for the circuit shown in FIG. 5 in which the interaction between the parent coil 210 and the idler coil 211 is adjusted to a resonant condition.

In various embodiments of the invention, when making the comparison between the two circuits, the same inductance for L1 (the idler coil inductor) and L2 (the sample coil inductor) can be used. In other embodiments of the invention, L1 and L2 can have different inductances. In embodiments of the invention, L1 and L2 can be chosen to have the same inductance to insure that they resonate at the same frequency. In an embodiment of the invention, the performance can be adjusted by changing the frequency of the resonance. In an embodiment of the invention, L1 and L2 can be approximately 15 nanoHenries (nH), where approximately in this range corresponds with ±2 nH. The quality factor ($Q_u$) of these inductors at resonance is approximately 440. In this range, approximately means + or − five (5) percent. The capacitors used in this comparison have sufficiently low loss that the quality factor (Q) of the coupling coils can be determined by the resistive losses in the inductors.

For routine high resolution NMR probes, the ability to do HFC experiments is highly desirable because often in working with complex molecules containing fluorine it is necessary to determine e.g., which $^{19}$F or $^1$H is attached to a particular carbon.

Coupling Coils

The use of inductive coupling to sample coupling coils rather than capacitive coupling has a number of advantages. The main advantage is that inductive coupling does not require the long leads associated with separating the parent coil 210 in the probe area away from the coupling coils distal to the probe area. However, inductive coupling for liquid samples required physically moving the idler coil in a manner which provides for coupling and uncoupling to the parent coil and the idler coil. Unexpectedly, it was found that the inductive coupling between the parent coil 210 and the coupling coils 1187, 1188 could be adjusted by using an idler coil 211 and/or adjusting the variable inductors 1171/1172 to inductively couple the idler coil 211 with the parent coil 210.

FIG. 8 is a schematic diagram showing a parent coil circuit including a parent coil 210, a power supply 1140 to generate the Larmor frequency, and variable capacitor 240 located above a lower insulator, 1020. Lead #1 1031, and lead #2, 1032 pass through the lower insulator, 1020 and connect the parent coil 210 to inductor #1, 1171, and inductor #2, 1172. Below the lower insulator, 1020, inductor #1 and #2, 1171, 1172 inductively couple to the tuned circuit through the coupling loops, 1187, 1188 where capacitors 1121, 1122, fifty (50) ohm coax, are used to complete the 50 Ohm $^{13}$C port, 680, $^1$H port, 681. The coupling loops comprising 1187 and 1188 are isolated from ground 690 through a variable coupling capacitor 1120, 1123. Below the lower insulator, 1020 are also located a tune variable capacitor, 626. The circuit including inductor #1, 1171 and inductor #2, 1172 are isolated from ground 690 through capacitors 624, 625.

Figure 9A:
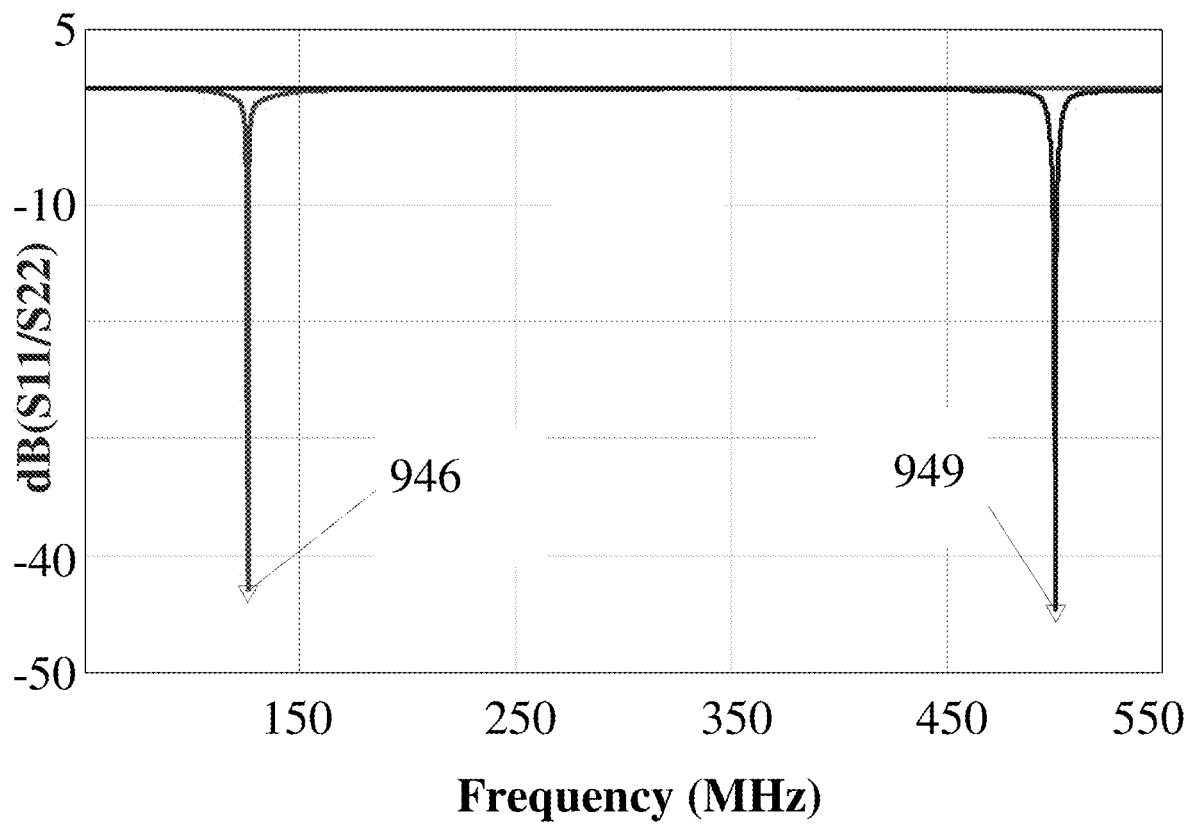
FIG. 9A is the simulated S11/S22 plot for the circuit in FIG. 8.
Figure 9B:
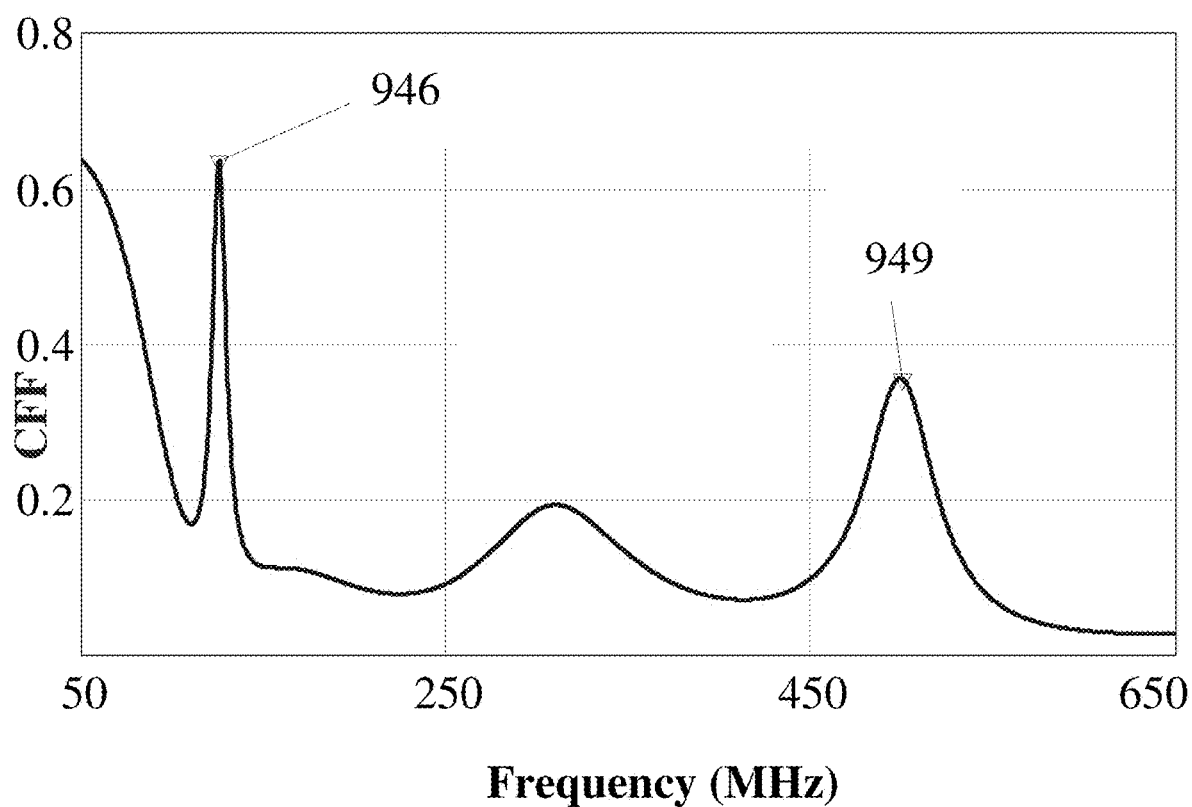
FIG. 9B is the simulated CFF for parent coil 210 in the circuit in FIG. 8 adjusted as in FIG. 9A.

FIG. 9A shows a plot of the simulated S11 plot for the circuit shown in FIG. 8 where there is coupling between the secondary coils 1171, 1172 and the coupling loops 1187, 1188 resulting in the $^{13}$C resonance minimum at 946 and the $^1$H minimum at 949 predominating. FIG. 9B is a plot of the simulated CFF for the circuit shown in FIG. 8 as adjusted in FIG. 9A.

FIG. 10 is a schematic diagram showing a parent coil circuit including a parent coil 210, a power supply 1140 to generate the Larmor frequency, a fixed capacitor 220, an idler coil circuit including an idler coil 211 and a variable capacitor 221 located above a lower insulator 1020. Lead #1 1031, and lead #2, 1032 pass through the lower insulator, 1020 and connect the parent coil 210 to variable inductor #1, 1171, and variable inductor #2, 1172. In an embodiment of the present invention, below the lower insulator, 1020, variable inductor #1 and #2, 1171, 1172 inductively couple to the tuned circuits through the coupling loops, 1187, 1188 where fixed capacitors 1121, 1122, fifty (50) ohm coax (connecting through a band pass filter 1112 and 1124), are used to complete the 50 Ohm $^1$H/$^{19}$F port, 681 (where port 680 is the $^{13}$C port). In an embodiment of the present invention, the coupling loops comprising 1187 and 1188 are isolated from ground 690 through variable coupling capacitors 1120, 1123. Below the lower insulator, 1020 are also located a tune variable capacitor, 626. In an embodiment of the present invention, the circuit including variable inductor #1, 1171 and variable inductor #2, 1172 are isolated from ground 690 through capacitors 625, 624. In an embodiment of the present invention, variable capacitor 1120 and fixed capacitor 1121 are selected to reject low frequencies. In an embodiment of the present invention, fixed capacitor 1124 and inductor 1112 are selected to reject high frequencies. In an embodiment of the present invention, port 680 can be selected to monitor the low frequency resonance and port 681 can be selected to monitor the high frequency resonance.

Figure 11A:
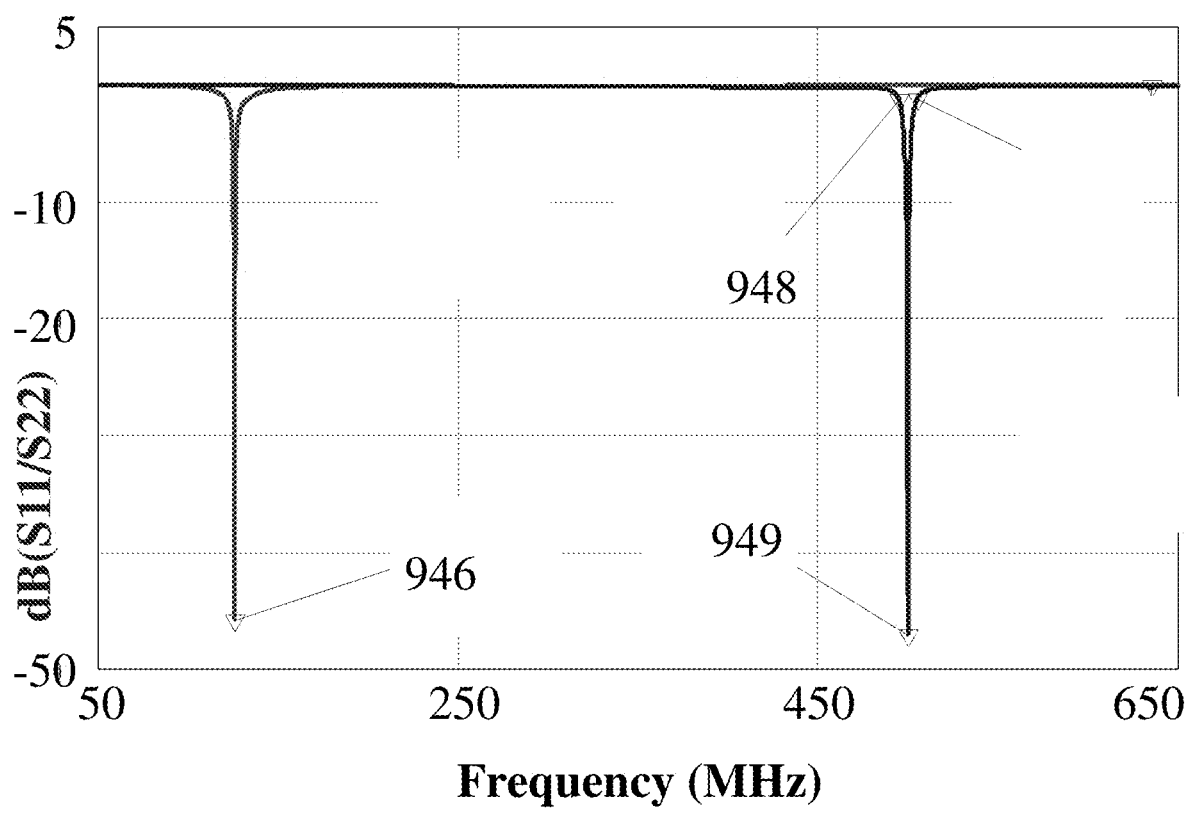
FIG. 11A is the simulated S11/S22 plot for the circuit in FIG. 10, where the variable capacitor 221 of the idler coil circuit adjusted such that the CFF for the circuit reflects the energy disproportionately in one nuclei resonance as shown in FIG. 11B, according to an embodiment of the invention.
Figure 11B:
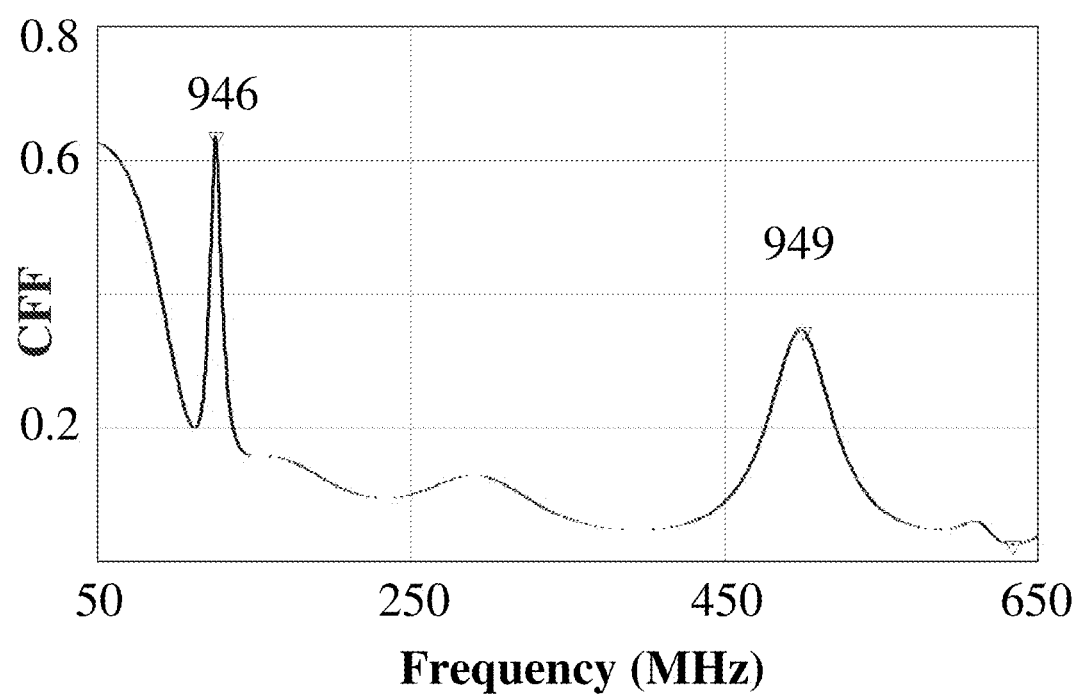
FIG. 11B is the simulated CFF for parent coil 210 in the circuit in FIG. 10 with the variable capacitor 221 of the idler coil circuit adjusted as in FIG. 11A, according to an embodiment of the invention.

FIG. 11A is the simulated S11/S22 plot for the circuit in FIG. 10 where the interaction between the parent coil 210 and the idler coil 211 is adjusted to a resonant condition, i.e., in which the variable capacitor 221 of the idler coil circuit is adjusted to approximately zero (+−2 pF) (and the variable inductors 1171 and 1172 are adjusted to approximately 20 nH), according to an embodiment of the invention. In FIG. 11A the parent coil 210 is inductively coupled to the coupling coils 1187, 1188, where the variable capacitor 221 of the idler coil 211 is adjusted such that the CFF for the circuit reflects the energy disproportionately in one nuclei resonance, e.g., if the first mode is $^{19}F$ and the second mode is $^1H$, the energy of the resonance of $^{19}F$ is disproportionally smaller than the energy of the $^1H$, resulting in the S22$^{13}C$ resonance minimum at 946 (126 MHz, −45.7 dB) and the S11$^1H$ resonance minimum at 949 (500 MHz, −47 dB). In FIG. 11A there is little or no $^{19}F$ resonance 948 (i.e., no minimum at 470 MHz (−0.06 dB)). This is in contrast with the significant S11 minimum 948 at 470 MHz (−30 dB) in FIG. 12A where the resonant condition has been optimized. FIG. 11B is the simulated CFF plot for parent coil 210 in the circuit in FIG. 10 with the variable capacitor 221 of the idler coil circuit adjusted as in FIG. 11A (in which the variable capacitor 221 of the idler coil circuit is adjusted such that 99 percent of the energy is accounted for (i.e., where the CFF sum energy for the circuit as shown in FIG. 10 as adjusted in FIG. 11A shown in FIG. 11B is 0.9944)) and sixty seven (67) percent of the energy is in the parent coil circuit. In FIG. 11B the $^{13}C$ resonance 946 maximum is at 126 MHz (CFF=0.6726) and the $^1H$ resonance 949 is at 500 MHz (CFF=0.3218).

Figure 12A:
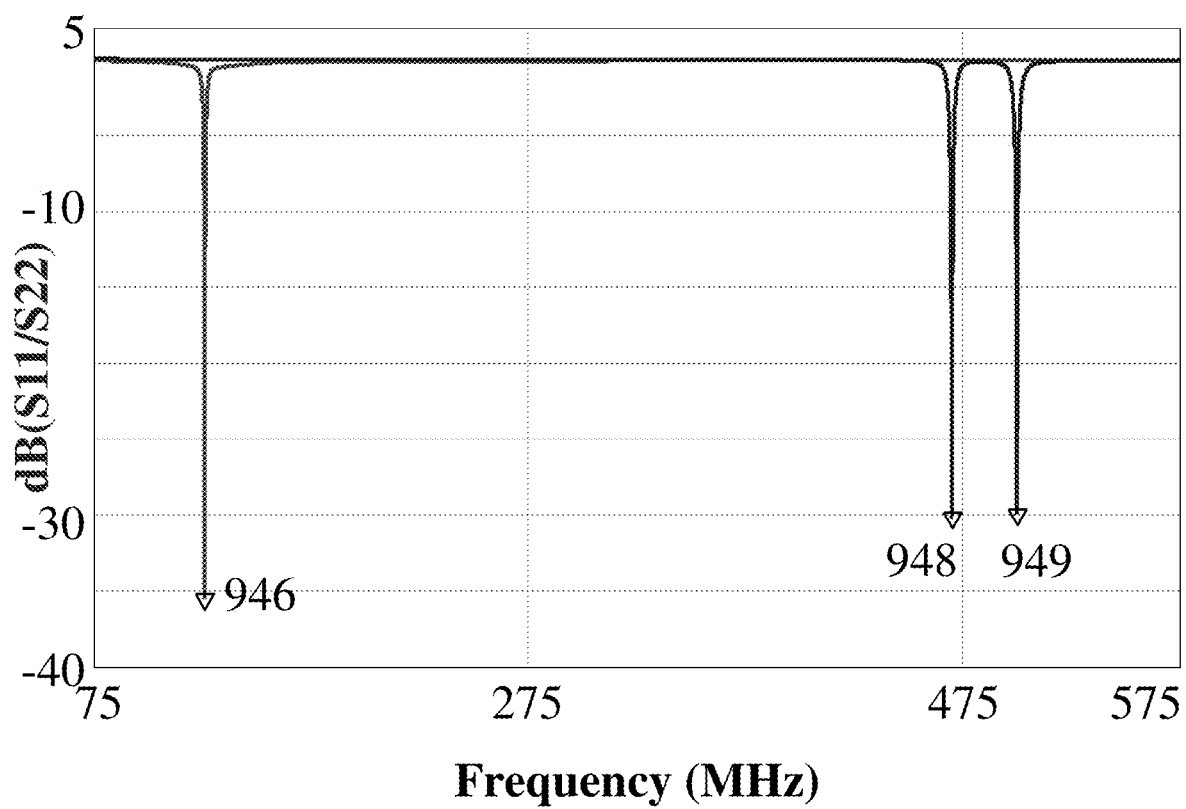
FIG. 12A is the simulated S11/S22 plot for the circuit in FIG. 10 where the resonant condition between the idler coil 211 and the parent coil 210 for two closely spaced nuclei is optimal, i.e., in which the variable capacitor 221 of the idler coil circuit and/or the variable inductors 1171 and 1172 are adjusted to adjust the frequency (e.g., approximately midway between 470 MHz and 500 MHz), according to an embodiment of the invention.
Figure 12B:
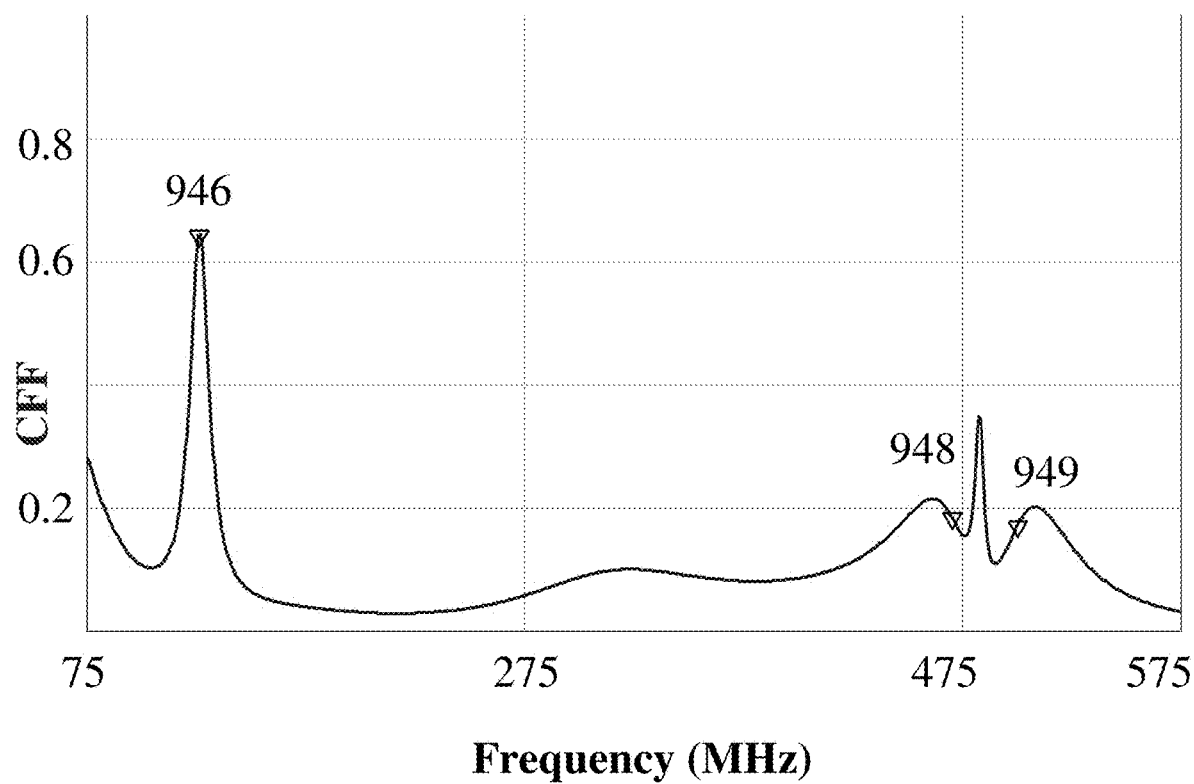
FIG. 12B is the simulated CFF for parent coil (210) in the circuit in FIG. 10 with the variable capacitor 221 of the idler coil circuit and/or the variable inductors 1171 and 1172 adjusted as in FIG. 12A, according to an embodiment of the invention.

In FIG. 10 there are two (2) coupling loops 1171 and 1172 and two (2) modes. In FIG. 10 if idler coil 211 is not inductively coupled with the parent coil 210, then the situation approximates that shown in FIG. 8 and FIG. 11A where the two modes $^{13}C$ and $^1H$ or $^{13}C$ and $^{19}F$ can be observed. In FIG. 10 the idler coil 211 can be used to couple to the parent coil 210. This is shown in FIG. 12A the simulated S11/S22 plot shows interaction between the parent coil 210 and the idler coil 211 is optimally adjusted to a resonant condition to observe the two high frequency modes $^{19}F$ resonance and $^1H$ resonance. In FIG. 12A a frequency is chosen using variable capacitor 221 in FIG. 10 (i.e., adjusted to 485 MHz, e.g., at a frequency between 450 MHz and 520 MHz, where the 450 MHz is chosen to be the low frequency end point of the $^{19}F$ resonance and 520 MHz the high frequency end point of the $^1H$ resonance). In FIG. 12A results in the S22 $^{13}C$ resonance 946 minimum at 126 MHz (−35.5 dB), or the S11$^{19}F$ resonance 948 minimum at 470 MHz (−30.13 dB) and the $^1H$ resonance minimum 949 minimum at 500 MHz (−29.94 dB). FIG. 12B is the simulated CFF plot for the parent coil 210 and idler coil 211 for the circuit shown in FIG. 10 with the variable capacitor 221 of the idler coil circuit and/or the variable inductors 1171 and 1172 adjusted as in FIG. 12A. In FIG. 12B the $^{13}C$ resonance 946 is shown at 126 MHz (CFF=0.6422), the $^{19}F$ resonance 948 is shown at 470 MHz (CFF=0.1843) and the comparable $^1H$ resonance 949 is shown at 500 MHz (CFF=0.1708). In FIG. 12B the interaction between the parent coil 210 and the idler coil 211 is optimally adjusted to a resonant condition as shown by the CFF for $^{19}F$ resonance 948 and $^1H$ resonance 949. The CFF sum energy for the circuit shown in FIG. 10 as adjusted in FIG. 12A i.e., as shown in FIG. 12B is 0.9973. In an embodiment of the present invention, variable capacitor 1120 and fixed capacitor 1121 are selected to reject low frequencies and capacitors 1124 and inductor 1112 are selected to reject high frequencies. Port 680 can be selected to monitor the low frequency resonance and port 681 can be selected to monitor the high frequency resonance. Coupling loops 1171, 1172 can be selected between 17 nH and 23 nH, variable capacitors 1120, 1123 can be selected between 1 pF and 10 pF and 1 pF and 50 pF respectively, and variable capacitor 221 between 1 pF and 6 pF.

Figure 13:
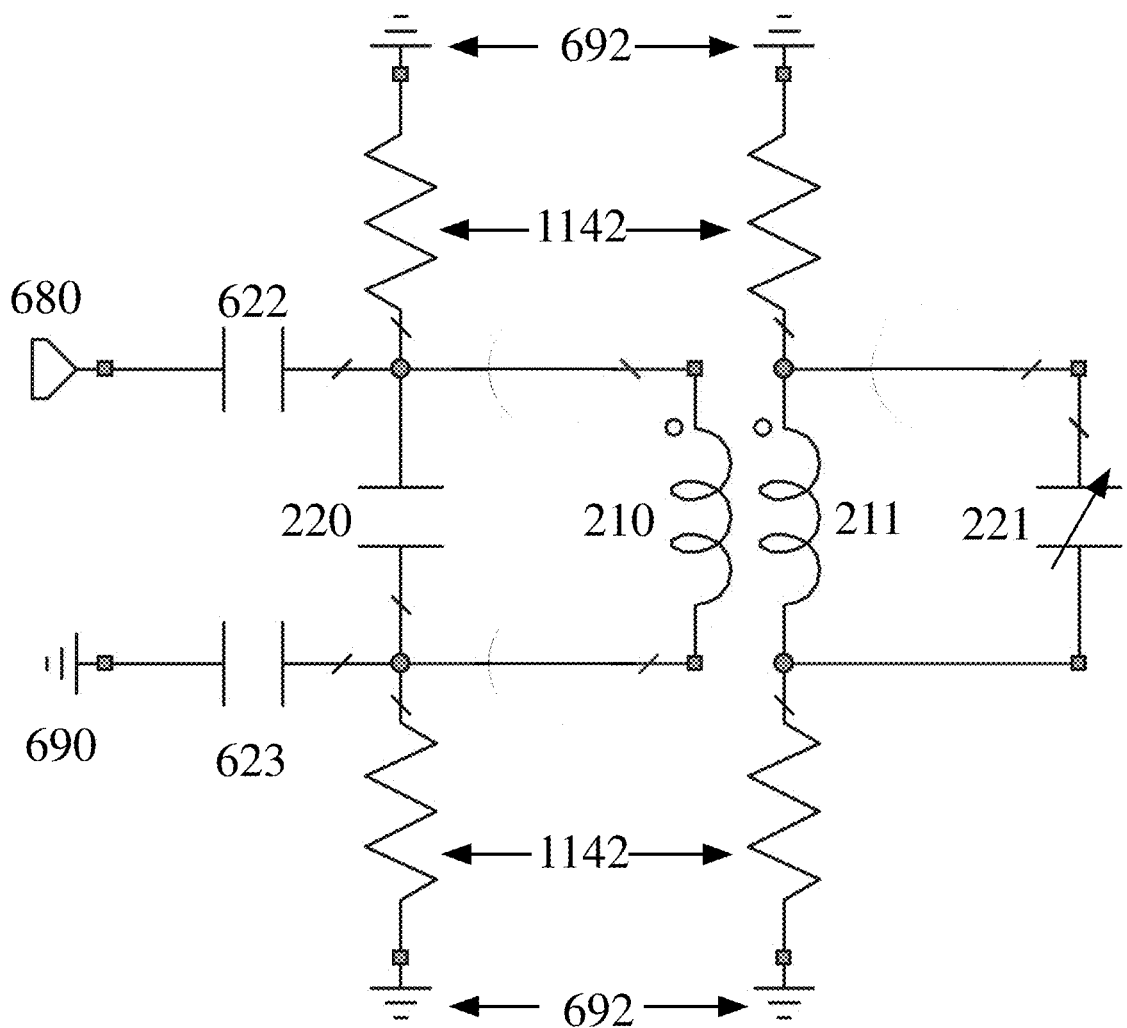
FIG. 13 is a schematic drawing of the circuit shown in FIG. 5 in which additional very high resistors 1142 connect to ground points 692 that are present in the circuit solely to prevent numerical instabilities in the dB and CFF calculations. These resistors 1142 and the ground points 692 are not required for measurement of samples using the circuit shown in FIG. 5 and are included for completeness in describing the circuit used to undertake the modelling calculations.

FIG. 13 is a schematic drawing of the circuit shown in FIG. 5 in which additional very high resistors 1142 (e.g., 1×10$^9$ Ohm) connect to ground points 692 that are present in the circuit solely to prevent numerical instabilities in the dB and CFF simulations. The 1142 resistors and the 692 ground points are not required for measurement of samples using the circuit shown in FIG. 5 and are included for completeness in describing the circuit used to undertake the modelling calculations (i.e., FIG. 6A, FIG. 6B, FIG. 7A, and FIG. 7B). Further, the prior art circuit shown in FIG. 8 also included 1142 resistors and the 692 ground points not required for measurement of samples for the modelling calculations shown in FIG. 9A, and FIG. 9B.

Figure 14:
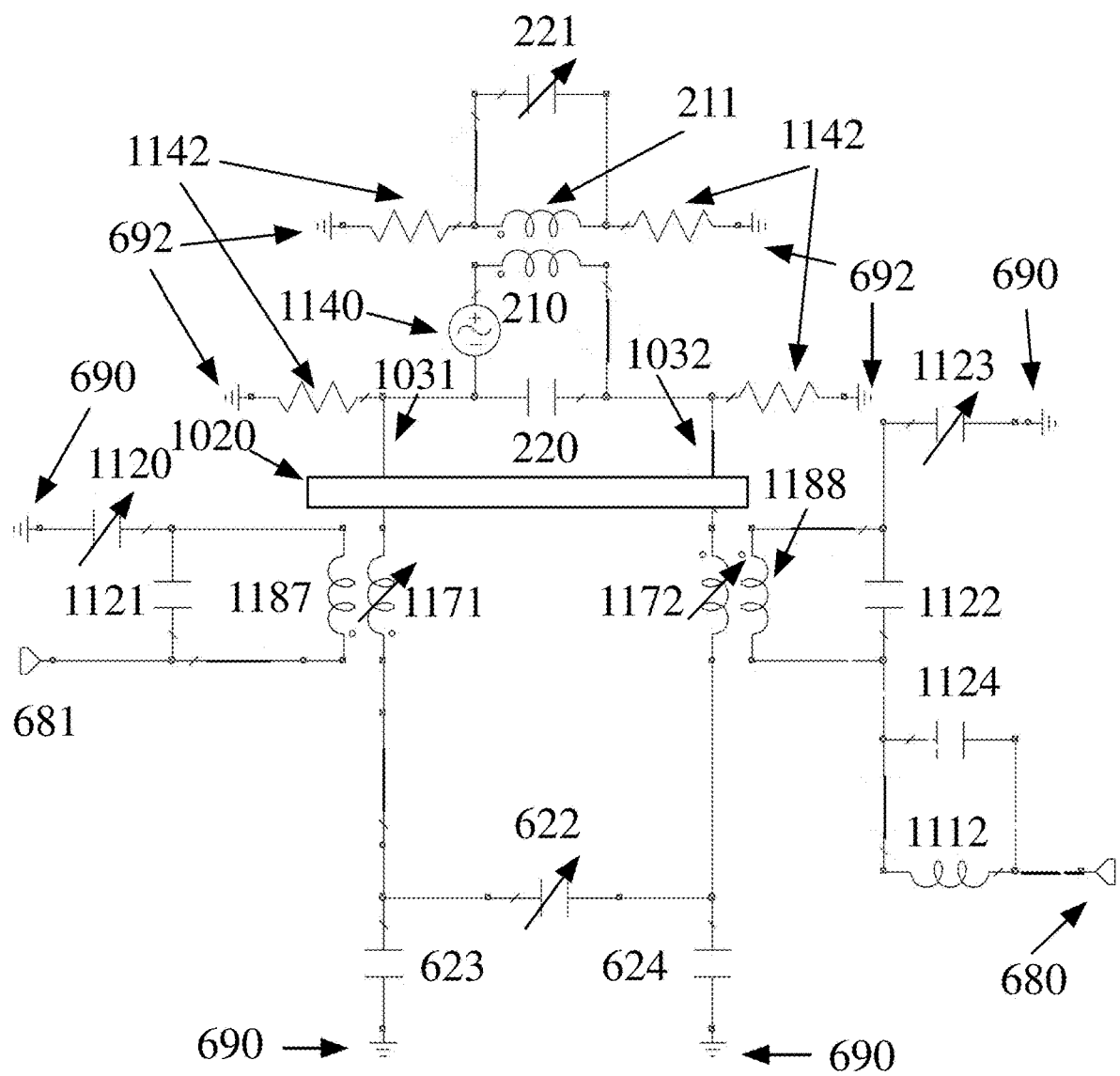
FIG. 14 is a schematic drawing of the circuit shown in FIG. 10 in which additional very high resistors 1142 connect to ground points 692 that are present in the circuit solely to prevent numerical instabilities in the dB and CFF calculations. These resistors 1142 and the ground points 692 are not required for measurement of samples using the circuit shown in FIG. 14 and are included for completeness in describing the circuit used to undertake the modelling calculations.

FIG. 14 is a schematic drawing of the circuit shown in FIG. 10 in which additional very high resistors 1142 (e.g., 1×10$^9$ Ohm) connect to ground points 692 that are present in the circuit solely to prevent numerical instabilities in the dB and CFF calculations. In the CFF calculations the value of resistors 1142 were set to 1.0×10$^9$ Ohm. These resistors 1142 and the ground points 692 are not required for measurement of samples using the circuit shown in FIG. 14 and are included for completeness in describing the circuit used to undertake the modelling calculations (i.e., FIG. 11A, FIG. 11B, FIG. 12A, and FIG. 12B).

Embodiments

Embodiment R1. A solid sample Nuclear Magnetic Resonance (NMR) probe (see e.g., FIG. 5) comprising: (a) a parent coil circuit comprising a fixed capacitor 220 and a parent coil 210 having an inductance L2, where the fixed capacitor 220 is selected based on one or more of a NMR instrument, a NMR probe and a solid sample to be analyzed; (b) a stator 202, where the stator 202 is adapted to rotate the solid sample, where a main axis of the stator is at a fixed angle relative to a magnetic field of the NMR instrument, where the stator is adapted to hold the solid sample at the fixed angle; (c) an idler coil circuit comprising a variable capacitor 221 and an idler coil having inductance L1, where the idler coil is adapted to orient relative to the parent coil circuit in a position, where the position of the idler coil relative to the parent coil is fixed such that K is constant, where the RF field symmetry of the parent coil is minimally affected by the position of the idler coil, and a means of adjusting the variable capacitor 221; (d) where introducing the NMR probe into the magnetic field, spinning the solid sample and exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2; and (e) adjusting the variable capacitor 221 to observe a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition.

Embodiment R2. The solid sample NMR probe of Embodiment R1, where the parent coil is a solenoidal coil.

Embodiment R3. The solid sample NMR probe of Embodiment R1, where the solid sample is a heterogeneous solid sample.

Embodiment R4. The solid sample NMR probe of Embodiment R1, where the first mode is detected simultaneously with the second mode.

Embodiment R5. The solid sample NMR probe of Embodiment R1, where the first mode is $^1$H and the second mode is $^{19}$F.

Embodiment R6. A solid sample Nuclear Magnetic Resonance (NMR) probe (see e.g., FIG. 10) comprising: (i) a first NMR probe portion located in a first region, the first NMR probe portion comprising: (A) a parent coil circuit comprising a fixed capacitor 220 and a parent coil 210 having a first inductance L2, where the fixed capacitor 220 is selected based on one or more of a NMR instrument, a NMR probe and a solid sample to be analyzed; (B) a stator 202 adapted to rotate the solid sample, where a main axis of the stator 202 is at a fixed angle relative to a magnetic field of the NMR instrument, where the stator 202 is adapted to hold the solid sample at the fixed angle; (C) an idler coil circuit comprising a variable capacitor 221 and an idler coil 211 having a second inductance L1 located within the NMR probe, where the idler coil surrounds at least a portion of the parent coil, where the idler coil 211 is adapted to orient relative to the parent coil circuit in a position, where the position of the idler coil 211 is adapted to be fixed relative to the parent coil such that K is constant, where the RF field symmetry of the parent coil 210 is minimally affected by the position of the idler coil 211, and a means of adjusting the variable capacitor 221, where the variable capacitor 221 is selected from the group consisting of a tuning capacitor, a trimmer variable capacitor, a sliding band capacitor, and an operational amplifier; and (ii) a second NMR probe portion located in a second region, where the second region is located a distance from the first region between: a lower limit of approximately $10^{-4}$ m; and an upper limit of approximately $10^{-2}$ m (in this circumstance, approximately means that the distance is plus or minus twenty (20) percent), the second NMR probe portion comprising: (D) one or more coupling coils, where the one or more coupling coils are electrically connected to at least one measurement port for detecting a nucleus resonance; (E) one or more secondary circuits including one or more variable inductor coils 1171/1172; where the one or more variable inductor coils 1171/1172 are electrically connected to the parent coil 210, where at least one of the one or more variable inductor coils 1171/1172 is inductively coupled to one or more coupling coils, where introducing the NMR probe into the magnetic field, spinning the solid sample and exciting the solid sample with a Radio Frequency (RF) field at a Larmor frequency and adjusting one or both the capacitance of the variable capacitor 221 and/or adjusting the variable inductors 1171/1172 to observe a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition, where a coupling constant (K) between the parent coil 210 and the idler coil 211 is given by $K=M*(L1*L2)^{1/2}$, where M is a mutual inductance between L1 and L2, and (F) where the at least one measurement port detects one or more of the two closely spaced nuclei resonances.

Embodiment R7. The solid sample NMR probe of Embodiment R6, where the parent coil is a solenoidal coil.

Embodiment R8. The solid sample NMR probe of Embodiment R6, where the solid sample is a heterogeneous solid sample.

Embodiment R9. The solid sample NMR probe of Embodiment R6, where the first mode is detected simultaneously with the second mode.

Embodiment R10. The solid sample NMR probe of Embodiment R6, where the first mode is $^1$H and the second mode is $^{19}$F.

Embodiment R11. A kit for adapting a NMR system to measure two (2) different nuclei of a solid sample (see e.g., FIG. 5) comprising: a fixed capacitor 220 selected based on one or more of a NMR instrument, a NMR probe and a solid sample to be analyzed; a solid sample NMR probe comprising the fixed capacitor 220, a stator, a holder and a parent coil 210 having an inductance L2, the holder adapted to contain the solid sample, the holder having a long axis, where the solid sample is inserted into the holder, where the solid sample and the holder are adapted to spin at a fixed angle relative to the magnetic field of a NMR field of the NMR system; a means for adjusting a variable capacitor 221; an idler coil circuit including an idler coil 211 (L1), and the variable capacitor 221, where the idler coil 211 is adapted to be located in a fixed position relative to the parent coil 210, where the fixed position allows the idler coil 211 to be inductively coupled to the parent coil 210 using the means for adjusting the variable capacitor 221, where the RF field symmetry of the parent coil 210 is minimally affected by the position of the idler coil 211, where adjusting the variable capacitor 221 to observe a tuned condition between the parent coil 210 and the idler coil 211, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition; and instructions for inserting the fixed capacitor 220 into the NMR probe and using the means for adjusting the variable capacitor 221 to couple the idler coil 211 to the parent coil 210 and detecting the first mode and the second mode.

Embodiment R12. The solid sample NMR probe kit of Embodiment R11, where the parent coil is a solenoidal coil.

Embodiment R13. The solid sample NMR probe kit of Embodiment R11, where the solid sample is a heterogeneous solid sample.

Embodiment R14. The solid sample NMR probe kit of Embodiment R11, where the first mode is detected simultaneously with the second mode.

Embodiment R15. The solid sample NMR probe kit of Embodiment R11, where the first mode is $^1$H and the second mode is $^{19}$F.

Embodiment R16. A kit for adapting a NMR system to measure dual nuclei of a solid sample (see e.g., FIG. 10) comprising: (i) a first NMR probe portion located in a first region, the first NMR probe portion comprising: (A) a parent coil circuit comprising a fixed capacitor 220 and a parent coil 210 having a first inductance L2, where the fixed capacitor 220 is selected based on one or more of a NMR instrument, a NMR probe and a solid sample to be analyzed; (B) a stator 202 adapted to rotate the solid sample, where a main axis of the stator 202 is at a fixed angle relative to a magnetic field of the NMR instrument, where the stator 202 is adapted to hold the solid sample at the fixed angle; (C) an idler coil circuit comprising a variable capacitor 221 and an idler coil 211 having a second inductance L1 located within the NMR probe, where the idler coil surrounds at least a portion of the parent coil, where the idler coil 211 is adapted to orient relative to the parent coil circuit in a position, where the position of the idler coil 211 is adapted to be fixed relative to the parent coil 210 such that K is constant, where the RF field symmetry of the parent coil 210 is minimally affected by the position of the idler coil 211, and a means of adjusting the variable capacitor 221; and (ii) a second region located a distance from the first region between: a lower limit of approximately $10^{-4}$ m; and an upper limit of approximately $10^{-2}$ m (in this circumstance, approximately means that the distance is plus or minus twenty (20) percent), the second region comprising: (D) one or more secondary circuits including one or more variable inductor coils 1171/1172; where the one or more variable inductor coils 1171/1172 are electrically connected to the parent coil 210, where at least one of the one or more variable inductor coils 1171/1172 is inductively coupled to one or more coupling coils, (E) where introducing the NMR probe into the magnetic field, spinning the solid sample and exciting the solid sample with a Radio Frequency (RF) field at a Larmor frequency and adjusting one or both the capacitance of the variable capacitor 221 and/or adjusting the variable inductors 1171/1172 to observe a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition, where a coupling constant (K) between the parent coil 210 and the idler coil 211 is given by $K=M*(L1*L2)^{1/2}$, where M is a mutual inductance between L1 and L2; and (F) where one or more inductive coupling loops detects one or more of the two closely spaced nuclei resonances.

Embodiment R17. The solid sample NMR probe kit of Embodiment R16, where the parent coil is a solenoidal coil.

Embodiment R18. The solid sample NMR probe kit of Embodiment R16, where the solid sample is a heterogeneous solid sample.

Embodiment R19. The solid sample NMR probe kit of Embodiment R16, where the first mode is detected simultaneously with the second mode.

Embodiment R20. The solid sample NMR probe kit of Embodiment R16, where the first mode is $^1$H and the second mode is $^{19}$F.

Embodiment R21. A method to detect two or more nuclei from a solid sample, comprising (a) receiving a solid sample, (b) selecting a fixed capacitor C2 based on one or more of a NMR instrument, a NMR probe and the solid sample to be analyzed, where the NMR probe comprises: (i) a stator, where the stator is adapted to rotate the solid sample, where a main axis of the stator is at a fixed angle relative to a magnetic field of the NMR instrument, where the stator is adapted to hold the solid sample at the fixed angle, (ii) a parent coil circuit comprising the fixed capacitor C2 and a parent coil having an inductance L2, and (iii) an idler coil circuit comprising a variable capacitor C1 and an idler coil having inductance L1 located within the NMR probe, where the idler coil surrounds the parent coil, where the idler coil is adapted to orient relative to the parent coil circuit in a position, where the position of the idler coil relative to the parent coil is adapted to remain fixed such that K is constant, where the RF field symmetry of the parent coil 210 is minimally affected by the position of the idler coil 211, (c) introducing the solid sample into the NMR probe, (d) introducing the NMR probe into the NMR instrument, (e) spinning the solid sample, where the stator is at the fixed angle, (f) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant, (g) adjusting the variable capacitor C1 to observe a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition, and (h) detecting the two closely spaced nuclei resonances.

Embodiment R22. The method of Embodiment R21, where the parent coil is a solenoidal coil.

Embodiment R23. The method of Embodiment R21, where the solid sample is a heterogeneous solid sample.

Embodiment R24. The method of Embodiment R21, where the first mode is detected simultaneously with the second mode.

Embodiment R25. The method of Embodiment R21, further comprising obtaining a NMR spectrum of the solid sample.

Embodiment R26. The method of Embodiment R21, where the first mode is $^1$H and the second mode is $^{19}$F.

Embodiment R26. The method of Embodiment R21, where the efficiency of detection of the second mode is between: a lower limit of approximately fifty five (55) percent; and an upper limit of approximately eighty five (85) percent. In this circumstance, approximately means that the efficiency is plus or minus ten (10) percent.

Embodiment R27. A method to detect one or more nuclei from solid samples, comprising: (a) selecting a solid sample; (b) selecting a fixed capacitor C2 based on one or more of a NMR instrument, a NMR probe and the solid sample to be analyzed, where the NMR probe comprises: (i) a first NMR probe portion located in a first region, the first NMR probe portion comprising: (A) a parent coil circuit comprising the fixed capacitor C2 and a parent coil having an inductance L2, (B) a stator, where the stator is adapted to rotate the solid sample, where a main axis of the stator is at a fixed angle relative to a magnetic field of the NMR instrument, where the stator is adapted to hold the solid sample at the fixed angle, and (C) an idler coil circuit comprising a variable capacitor C1 and an idler coil having inductance L1 located within the NMR probe, where the idler coil surrounds at least a portion of the parent coil, where the idler coil is adapted to orient relative to the parent coil circuit in a position, where the position of the idler coil relative to the parent coil is adapted to remain fixed such that K is constant, where the RF field symmetry of the parent coil 210 is minimally affected by the position of the idler coil 211, where the variable capacitor C1 is selected from the group consisting of a tuning capacitor, a trimmer variable capacitor, a sliding band capacitor, and an operational amplifier, (ii) a second NMR probe portion located in a second region, where the second region is located a distance from the first region between: a lower limit of approximately $10^{-4}$ m; and an upper limit of approximately $10^{-2}$ m (in this circumstance, approximately means that the distance is plus or minus twenty (20) percent), the second NMR probe portion comprising: (D) one or more coupling coils, where the one or more coupling coils are electrically connected to at least one measurement port for detecting a resonance, and (E) one or more secondary circuits including one or more variable inductor coils (L3/L4) 1171/1172; where the one or more variable inductor coils (L3/L4) are electrically connected to the parent coil, where at least one of the one or more variable inductor coils (L3/L4) is inductively coupled to the one or more coupling coils, where the one or more variable inductor coils (L3/L4) are selected from the group consisting of one or more of a metallic core variable inductor, (e.g. a silver core variable inductor, a copper core variable inductor and the like), a carbon core variable inductor, an air core variable inductor, a sliding variable inductor, (c) introducing the solid sample into the NMR probe, (d) introducing the NMR probe into the magnetic field of the NMR instrument, (e) spinning the solid sample, where the stator is at the fixed angle, (f) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant, (g) adjusting the variable capacitor C1 to observe a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition, and (h) detecting at least one of the two closely spaced nuclei resonances at the measurement port.

Embodiment R28. The method of Embodiment R27, where the parent coil is a solenoidal coil.

Embodiment R29. The method of Embodiment R27, where the solid sample is a homogeneous solid sample.

Embodiment R30. The method of Embodiment R27, where the solid sample is a heterogeneous solid sample.

Embodiment R31. The method of Embodiment R27, further comprising obtaining a NMR spectrum of the solid sample.

Embodiment R32. The method of Embodiment R27, where the first mode is $^1$H and the second mode is $^{19}$F.

Embodiment R33. The method of Embodiment R27, where the first mode is detected simultaneously with the second mode.

Embodiment R34. The method of Embodiment R27, further comprising where at least two variable inductor coils of the one or more variable inductor coils (L3/L4) are inductively coupled to two coupling coils of the one or more coupling coils, where a first coupling coil is electrically connected to a first measurement port for detecting a first nucleus resonance, where a second coupling coil is electrically connected to a second measurement port for detecting a second nucleus resonance.

Embodiment R35. The method of Embodiment R34, where the first nucleus resonance is detected simultaneously with the second nucleus resonance.

Embodiment R36. The method of Embodiment R34, where the first mode is $^1$H and the second mode is $^{19}$F.

Embodiment R37. A method to detect one or more nuclei from solid samples, comprising: (a) selecting a solid sample, (b) selecting a fixed capacitor C2 based on one or more of a NMR instrument, a NMR probe and the solid sample to be analyzed, where the NMR probe comprises: (i) a first NMR probe portion located in a first region, the first NMR probe portion comprising: (A) a parent coil circuit comprising the fixed capacitor C2 and a parent coil having an inductance L2, (B) a stator, where the stator is adapted to rotate the solid sample, where a main axis of the stator is at a fixed angle relative to a magnetic field of the NMR instrument, where the stator is adapted to hold the solid sample at the fixed angle, (C) an idler coil circuit comprising a variable capacitor C1 and an idler coil having inductance L1 located within the NMR probe, where the idler coil surrounds at least a portion of the parent coil, where the idler coil is adapted to orient relative to the parent coil circuit in a position, where the position of the idler coil relative to the parent coil is adapted to remain fixed, where the RF field symmetry of the parent coil is minimally affected by the position of the idler coil, where the variable capacitor C1 is selected from the group consisting of a tuning capacitor, a trimmer variable capacitor, and a sliding band capacitor, (ii) an insulator, and (iii) a second NMR probe portion located in a second region, where the insulator separates the first NMR probe portion in the first region from the second NMR probe portion in the second region, the second NMR probe portion comprising: (D) one or more coupling coils, where the one or more coupling coils are electrically connected to a measurement port for detecting a resonance, and (E) one or more secondary circuits including one or more variable inductor coils (L3/L4) (1171/1172); where the one or more variable inductor coils (L3/L4) are electrically connected to the parent coil, where at least one of the one or more variable inductor coils (L3/L4) is inductively coupled to the one or more coupling coils, where the one or more variable inductor coils (L3/L4) are selected from the group consisting of an iron core variable inductor, a carbon core variable inductor, an air core variable inductor, a sliding variable inductor, (c) introducing the solid sample into the NMR probe, (d) introducing the NMR probe into the magnetic field of the NMR instrument, (e) spinning the solid sample, where the stator is at the fixed angle, (f) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant, (g) adjusting one or both the variable capacitor C1 and/or one of the one or more variable inductor coils (L3/L4) to observe a tuned condition between the parent coil and the idler coil, where the S11 plot of the two closely spaced nuclei are matched to a minimal reflective power, where the frequency is adjusted between the two closely spaced nuclei frequencies, where the CFF of the two closely spaced nuclei are approximately equal at the tuned condition, and (h) detecting at least one of the first mode or the second mode at the measurement port.

Embodiment R38. The method of Embodiment R37, where the parent coil is a solenoidal coil.

Embodiment R39. The method of Embodiment R37, where the solid sample is a homogeneous solid sample.

Embodiment R40. The method of Embodiment R37, where the solid sample is a heterogeneous solid sample.

Embodiment R41. The method of Embodiment R37, further comprising obtaining a NMR spectrum of the solid sample.

Embodiment R42. The method of Embodiment R37, where the first mode is $^1$H and the second mode is $^{19}$F.

Embodiment R43. The method of Embodiment R37, where the first mode is detected simultaneously with the second mode.

Embodiment R44. The method of Embodiment R37, further comprising where at least two variable inductor coils of the one or more variable inductor coils (L3/L4) are inductively coupled to two coupling coils of the one or more coupling coils, where a first coupling coil is electrically connected to a first measurement port for detecting a first nucleus resonance, where a second coupling coil is electrically connected to a second measurement port for detecting a second nucleus resonance.

Embodiment R45. The method of Embodiment R44, where the first nucleus resonance is detected simultaneously with the second nucleus resonance.

Embodiment R46. The method of Embodiment R44, where the first mode is $^1$H and the second mode is $^{19}$F.

Embodiment R47. A method to detect two resonances of two closely spaced nuclei from solid samples, comprising selecting a solid sample, selecting a fixed capacitor C2 based on one or more of a NMR instrument, a NMR probe and the solid sample to be analyzed, where the NMR probe comprises a stator, where the stator is adapted to rotate the solid sample, where a main axis of the stator is at a fixed angle relative to a magnetic field of the NMR instrument, where the stator is adapted to hold the solid sample at the fixed angle, a parent coil circuit comprising the fixed capacitor C2 and a parent coil having an inductance L2, and an idler coil circuit comprising a variable capacitor C1 and an idler coil having inductance L1 located within the NMR probe, where the idler coil at least partially surrounds the parent coil, where the idler coil is adapted to orient relative to the parent coil circuit in a position, where the position of the idler coil relative to the parent coil is adapted to remain fixed, where the RF field symmetry of the parent coil is not affected by the position of the idler coil, introducing the solid sample into the NMR probe, introducing the NMR probe into the magnetic field of the NMR instrument, spinning the solid sample, where the stator is at the fixed angle, exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant, adjusting the variable capacitor C1 to observe a tuned condition between the parent coil and the idler coil, where the S11 plot of the two closely spaced nuclei are matched to a minimal reflective power, where the variable capacitor C1 adjusts between a frequency to between a resonant frequency of the two closely spaced nuclei, where a Circuit Fill Factor (CFF) of the two closely spaced nuclei are approximately equal, where the CFF of the first mode is between a lower limit of approximately fifty (50) percent of the total energy in the circuit, and an upper limit of approximately eighty five (85) percent of the total energy in the circuit approximately equal at the tuned condition, and detecting the two resonances of the two closely spaced nuclei.

Embodiment R48. A method to detect two resonances of two closely spaced nuclei from solid samples, comprising selecting a solid sample, selecting a fixed capacitor (220) based on one or more of a NMR instrument, a NMR probe and the solid sample to be analyzed, where the NMR probe comprises a stator, where the stator is adapted to rotate the solid sample, where a main axis of the stator is at a fixed angle relative to a magnetic field of the NMR instrument, where the stator is adapted to hold the solid sample at the fixed angle, an electrical circuit including circuit elements 680, 690, 625, 220, 623, 210, 211, 221, and connections therebetween as set forth in part in FIG. 13, comprising a parent coil (210) with a first inductance L2, the fixed capacitor (220) and a port (680), and an idler coil (211) with a second inductance L1 and a variable capacitor (221), where the idler coil (211) at least partially surrounds the parent coil (210), where the idler coil (211) is adapted to orient relative to the parent coil (210) circuit in a position, where the position of the idler coil (211) is adapted to remain fixed, introducing the solid sample into the NMR probe, introducing the NMR probe into the magnetic field of the NMR instrument, spinning the solid sample, where the stator is at the fixed angle, where the position of the idler coil (211) is fixed exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant, where the RF field symmetry of the parent coil (210) is not affected by the position of the idler coil (211), where the idler coil (211) is adjusted to resonate close to the parent coil (210) frequency, adjusting the variable capacitor (211) such that the interaction between the parent coil (210) and the idler coil (211) is optimally adjusted to a resonant condition, and detecting the resonant condition of the two or more nuclei.

Embodiment R49. The method of Embodiment R48, where the parent coil is a solenoidal coil.

Embodiment R50. The method of Embodiment R48, where the solid sample is a homogeneous solid sample.

Embodiment R51. The method of Embodiment R48, where the solid sample is a heterogeneous solid sample.

Embodiment R52. The method of Embodiment R48, where the resonant condition of the two or more nuclei are detected simultaneously.

Embodiment R53. The method of Embodiment R48, where the two or more nuclei comprise at least $^1$H and $^{19}$F.

Embodiment R54. A method to detect one or more nuclei resonances from solid samples with resonances of two closely spaced nuclei, comprising (A) selecting a solid sample; (B) selecting a fixed capacitor (220) based on one or more of a NMR instrument, a NMR probe and the solid sample to be analyzed, where the NMR probe comprises: (i) a first NMR probe portion located in a first region, the first NMR probe portion comprising: (a) a stator, where the stator is adapted to rotate the solid sample, where a main axis of the stator is at a fixed angle relative to a magnetic field of the NMR instrument, where the stator is adapted to hold the solid sample at the fixed angle; (b) an electrical circuit including circuit elements 690, 1120, 1121, 681, 1140, 1031, 1187, 221, 211, 210, 220, 1020, 1171, 626, 625, 1032, 1172, 1188, 624, 1123, 1122, 1124, 1112, and electrical connections therebetween as set forth in part in FIG. 14, comprising a parent coil (210) with a first inductance L2 and the fixed capacitor (220); and (c) an idler coil (211) located within the NMR probe with a second inductance L1 and a variable capacitor (221), where the idler coil (211) at least partially surrounds the parent coil (210), where the idler coil (211) is adapted to orient relative to the parent coil (210) in a position, where the position of the idler coil (211) relative to the parent coil (210) is adapted to remain fixed, where a RF field symmetry of the parent coil (210) is not affected by the position of the idler coil (211), where the variable capacitor (221) is selected from the group consisting of a tuning capacitor, a trimmer variable capacitor, a sliding band capacitor, and an operational amplifier; (ii) an insulator (1020); and (iii) a second NMR probe portion located in a second region, where the second region is located a distance from the first region between: a lower limit of approximately $10^{-4}$ m; and an upper limit of approximately $10^{-2}$ m (in this circumstance, approximately means that the distance is plus or minus twenty (20) percent), where the insulator (1020) separates the first NMR probe portion in the first region from the second NMR probe portion in the second region, the second NMR probe portion comprising: (d) one or more coupling coils, where the one or more coupling coils (1187/1188) are electrically connected to at least one measurement port (680, 681) for detecting a nucleus resonance; and (e) one or more secondary circuits including one or more variable inductor coils (1171/1172); where the one or more variable inductor coils (1171/1172) are electrically connected to the parent coil (210), where at least one of the one or more variable inductor coils (1171/1172) is inductively coupled to the one or more coupling coils (1187/1188); (C) introducing the solid sample into the NMR probe; (D) introducing the NMR probe into the magnetic field of the NMR instrument; (E) spinning the solid sample, where the stator is at the fixed angle, where the position of the idler coil (211) is fixed; (F) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant, where the RF field symmetry of the parent coil (210) is not affected by the position of the idler coil (211), where the idler coil (211) is adjusted to resonate close to the parent coil (210) frequency; (G) adjusting one or both the variable capacitor (211) and/or one of the one or more variable inductor coils (1171/1172) such that the interaction between the parent coil (210) and the idler coil (211) is optimally adjusted to a resonant condition, where a S11 plot of two closely spaced nuclei are matched to a minimal reflective power, where a Circuit Fill Factor of the two closely spaced nuclei are approximately equal at the resonant condition; and (H) detecting the resonant condition of the two closely spaced nuclei at the at least one measurement port.

Embodiment R55. The method of Embodiment R54, where a first resonance mode of the two closely spaced nuclei is detected simultaneously with a second resonance mode of the two closely spaced nuclei.

Embodiment R56. The method of Embodiment R54, where the one or more variable inductor coils (1171/1172) are selected from the group consisting of one or more of a metallic core variable inductor, a silver core variable inductor, a copper core variable inductor, a carbon core variable inductor, an air core variable inductor, and a sliding variable inductor.

Embodiment R57. The method of Embodiment R54, where the solid sample is a heterogeneous solid sample.

Embodiment R58. The method of Embodiment R54, further comprising where at least two variable inductor coils of the one or more variable inductor coils (1171/1172) are inductively coupled to two coupling coils of the one or more coupling coils, where a first coupling coil is electrically connected to a first measurement port for detecting a first nucleus resonance, where a second coupling coil is electrically connected to a second measurement port for detecting a second nucleus resonance.

Embodiment R59. The method of Embodiment R58, where the first nucleus resonance is detected simultaneously with the second nucleus resonance.

Embodiment R60. The method of Embodiment R58, where the first nucleus resonance is $^1H$ and the second nucleus resonance is $^{19}F$.

In various embodiments of the invention, a high resolution solid sample MAS NMR probe can monitor dual nuclei to perform HFC experiments on demand by selecting an appropriate fixed capacitor with the parent coil circuit, an idler coil inductively coupled to the parent coil at a fixed position and adjusting a variable capacitor in the idler coil circuit and/or adjusting variable inductors to adjust the parent resonance to inductively couple with the coupling coils. Unexpectedly, the high resolution solid sample MAS NMR probe could be inductively coupled to the coupling coils. An advantageous effect was the ability to monitor $^{19}F$ and $^1H$ modes in a solid sample MAS NMR probe. In various embodiments of the invention, a high resolution NMR probe can routinely monitor two (2) different nuclei to perform HFX experiments where X is any low-band nucleus. In various embodiments of the invention, a high resolution NMR probe can routinely monitor two (2) different nuclei to perform analysis on a probe without losses to the normal dual broadband function of the probe. In various embodiments of the invention, a high resolution NMR probe can routinely monitor $^{19}F$ and another nucleus to perform fluorine spectrometry.

While the systems, methods, and devices have been illustrated by the described examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and devices provided herein. Additional advantages and modifications will readily be apparent to those skilled in the art. Therefore, the invention, in its broader aspects, is not limited to the specific details, the representative system, method or device, and illustrative examples shown and described. Accordingly, departures may be made from such details without departing from the spirit or scope of the applicant's general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

What is claimed is:

1. A method to display a S11 plot of two closely spaced nuclei resonances from a solid sample, comprising:
    (a) selecting a solid sample;
    (b) selecting a fixed capacitor C2 based on one or more of a NMR instrument, a NMR probe and the solid sample to be analyzed, where the NMR probe comprises:
        (i) a stator, where the stator is adapted to rotate the solid sample, where a main axis of the stator is at a fixed angle relative to a magnetic field of the NMR instrument, where the stator is adapted to hold the solid sample at the fixed angle;
        (ii) a parent coil circuit comprising the fixed capacitor C2 and a parent coil having an inductance L2; and
        (iii) an idler coil circuit comprising a variable capacitor C1 and an idler coil having inductance L1 located within the NMR probe, where the idler coil at least partially surrounds the parent coil, where the idler coil is adapted to orient relative to the parent coil circuit in a position, where the position of the idler coil relative to the parent coil is adapted to remain fixed, where RF field symmetry of the parent coil is not affected by the position of the idler coil;
    (c) introducing the solid sample into the NMR probe;
    (d) introducing the NMR probe into the magnetic field of the NMR instrument;
    (e) spinning the solid sample, where the stator is at the fixed angle;
    (f) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant;
    (g) adjusting the variable capacitor C1 to observe a tuned condition between the parent coil and the idler coil, where a S11 plot of the two closely spaced nuclei resonances are matched to a minimal reflective power, where the variable capacitor C1 adjusts between a frequency to between a resonant frequency of the two closely spaced nuclei;

(h) detecting two resonances of the two closely spaced nuclei; and
(i) displaying the S11 plot.

2. The method of claim 1, where the solid sample is a heterogeneous solid sample.

3. The method of claim 1, where a first mode of two closely spaced nuclei resonances is detected simultaneously with a second mode of the two closely spaced nuclei.

4. The method of claim 3, further comprising obtaining a NMR spectrum of the solid sample.

5. The method of claim 3, further comprising where a comparison of a Circuit Fill Factor of the two closely spaced nuclei resonances is approximately equal at the tuned condition.

6. The method of claim 5, where the Circuit Fill Factor of a first mode is between:
   a lower limit of approximately fifty (50) percent of total energy in the parent coil circuit; and
   an upper limit of approximately eighty five (85) percent of total energy in the parent coil circuit.

7. A method to compare a Circuit Fill Factor (CFF) of two closely spaced nuclei resonances in a solid sample, comprising:
   (a) receiving a solid sample from a user;
   (b) selecting a fixed capacitor C2 based on one or more of a NMR instrument, a NMR probe and the solid sample to be analyzed, where the NMR probe comprises:
      (i) a stator, where the stator is adapted to rotate the solid sample, where a main axis of the stator is at a fixed angle relative to a magnetic field of the NMR instrument, where the stator is adapted to hold the solid sample at the fixed angle;
      (ii) a parent coil circuit comprising the fixed capacitor C2 and a parent coil having an inductance L2; and
      (iii) an idler coil circuit comprising a variable capacitor C1 and an idler coil having inductance L1 located within the NMR probe, where the idler coil surrounds the parent coil, where the idler coil is adapted to orient relative to the parent coil circuit in a position, where the position of the idler coil relative to the parent coil is adapted to be fixed, where RF field symmetry of the parent coil is not affected by the position of the idler coil;
   (c) introducing the solid sample into the NMR probe;
   (d) introducing the NMR probe into the NMR instrument;
   (e) spinning the solid sample, where the stator is at the fixed angle;
   (f) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant;
   (g) adjusting the variable capacitor C1 to observe a tuned condition between the parent coil and the idler coil, where a S 11 plot of two closely spaced nuclei resonances are matched to a minimal reflective power, where the variable capacitor C1 adjusts a frequency to between a resonant frequency of the two closely spaced nuclei resonances, where a comparison of the CFF of the two closely spaced nuclei resonances is approximately equal at the tuned condition;
   (h) detecting at least a resonance of the two closely spaced nuclei resonances;
   (i) comparing the CFF of the two closely spaced nuclei resonances; and
   (j) making said comparison in step (i) available to the user.

8. The method of claim 7, where the solid sample is a homogeneous solid sample.

9. The method of claim 7, where the solid sample is a heterogeneous solid sample.

10. The method of claim 7, where a first mode of the two closely spaced nuclei resonances is detected simultaneously with a second mode.

11. The method of claim 10, further comprising obtaining a NMR spectrum of the solid sample.

12. The method of claim 10, where the first mode is $^{19}$F, and the second mode is $^{1}$H.

13. The method of claim 10, where the CFF of the first mode is between:
   a lower limit of approximately fifty (50) percent of total energy in the parent coil circuit; and
   an upper limit of approximately eighty five (85) percent of total energy in the parent coil circuit.

14. A method to display at least a piece of a NMR spectrum of a solid sample of two closely spaced nuclei resonances, comprising:
   (a) selecting a solid sample;
   (b) selecting a fixed capacitor C2 based on one or more of a NMR instrument, a NMR probe and the solid sample to be analyzed, where the NMR probe comprises:
      (i) a first NMR probe part located in a first region, the first NMR probe part comprising:
         (A) a parent coil circuit comprising the fixed capacitor C2 and a parent coil having an inductance L2;
         (B) a stator, where the stator is adapted to rotate the solid sample, where a main axis of the stator is at a fixed angle relative to a magnetic field of the NMR instrument, where the stator is adapted to hold the solid sample at the fixed angle; and
         (C) an idler coil circuit comprising a variable capacitor C1 and an idler coil having inductance L1 located within the NMR probe, where the idler coil surrounds at least a portion of the parent coil, where the idler coil is adapted to orient relative to the parent coil circuit in a position, where the position of the idler coil relative to the parent coil is adapted to remain fixed, where RF field symmetry of the parent coil is not affected by the position of the idler coil, where the variable capacitor C1 is selected from the group consisting of a tuning capacitor, a trimmer variable capacitor, a sliding band capacitor, and an operational amplifier;
      (ii) an insulator; and
      (iii) a second NMR probe part located in a second region, where the second region is located a distance from the first region between: a lower limit of approximately $10^{-4}$ m; and an upper limit of approximately $10^{-2}$ m, where the insulator separates the first NMR probe portion part in the first region from the second NMR probe part in the second region, the second NMR probe part comprising:
         (D) one or more coupling coils, where the one or more coupling coils are electrically connected to at least one measurement port for detecting a nucleus resonance; and
         (E) one or more secondary circuits including one or more variable inductor coils (L3/L4); where the one or more variable inductor coils (L3/L4) are electrically connected to the parent coil, where at least one of the one or more variable inductor coils (L3/L4) is inductively coupled to the one or more coupling coils;
   (c) introducing the solid sample into the NMR probe;

(d) introducing the NMR probe into the magnetic field of the NMR instrument;
(e) spinning the solid sample, where the stator is at the fixed angle;
(f) exciting the solid sample with a Radio Frequency (RF) field at a Larmor frequency, where a coupling constant (K) between the parent coil and the idler coil is given by $K=M*(L1*L2)^{1/2}$, where M is a mutual inductance between L1 and L2, where K is constant;
(g) adjusting one or both the variable capacitor C1 and/or one of the one or more variable inductor coils (L3/L4) to observe a tuned condition between the parent coil and the idler coil, where a S11 plot of two closely spaced nuclei resonances are matched to a minimal reflective power, where the variable capacitor C1 adjusts between two closely spaced nuclei resonances, where a comparison of the Circuit Fill Factor of the two closely spaced nuclei resonances is approximately equal at the tuned condition; and
(h) detecting at least a resonance of the two closely spaced nuclei resonances at the at least one measurement port; and
(i) displaying at least a piece of a NMR spectrum of the solid sample.

15. The method of claim 14, where a first mode of the two closely spaced nuclei resonances is detected simultaneously with a second mode.

16. The method of claim 14, where the one or more variable inductor coils (L3/L4) are selected from the group consisting of one or more of a metallic core variable inductor, a silver core variable inductor, a copper core variable inductor, a carbon core variable inductor, an air core variable inductor, and a sliding variable inductor.

17. The method of claim 14, where the solid sample is a heterogeneous solid sample.

18. The method of claim 14, further comprising where at least two variable inductor coils of the one or more variable inductor coils (L3/L4) are inductively coupled to two coupling coils of the one or more coupling coils, where a first coupling coil is electrically connected to a first measurement port for detecting a first nucleus resonance, where a second coupling coil is electrically connected to a second measurement port for detecting a second nucleus resonance.

19. The method of claim 18, where the first nucleus resonance is detected simultaneously with the second nucleus resonance.

20. The method of claim 18, where the first nucleus resonance is $^1H$ and the second nucleus resonance is $^{19}F$.

* * * * *